(12) United States Patent
Tanamura et al.

(10) Patent No.: US 6,306,559 B1
(45) Date of Patent: Oct. 23, 2001

(54) ORGANIC ELECTROLUMINESCENT DEVICE COMPRISING A PATTERNED PHOTOSENSITIVE COMPOSITION AND A METHOD FOR PRODUCING SAME

(75) Inventors: Mitsuru Tanamura; Eisuke Fujiwara; Yoshiharu Sato, all of Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 09/487,220

(22) Filed: Jan. 19, 2000

(30) Foreign Application Priority Data

Jan. 26, 1999 (JP) ................................. 11-017311
Jan. 26, 1999 (JP) ................................. 11-017312
Apr. 30, 1999 (JP) ................................. 11-124385

(51) Int. Cl.[7] ............................................. H05B 33/00
(52) U.S. Cl. ................... 430/315; 430/319; 430/321; 313/504
(58) Field of Search .................... 430/315, 319, 430/321; 445/24; 313/504

(56) References Cited

U.S. PATENT DOCUMENTS

| | | |
|---|---|---|
| 5,059,863 | 10/1991 | Tashiro et al. . |
| 5,104,749 | 4/1992 | Sato et al. . |
| 5,247,226 | 9/1993 | Sato et al. . |
| 5,276,380 | 1/1994 | Tang . |
| 5,294,869 | 3/1994 | Tang et al. . |
| 5,701,055 | 12/1997 | Nagayama et al. . |
| 5,773,931 | * 6/1998 | Shi et al. ......................... 313/509 |
| 5,800,952 | 9/1998 | Urano et al. . |
| 5,863,678 | 1/1999 | Urano et al. . |
| 5,914,206 | 6/1999 | Takasaki et al. . |
| 5,916,713 | 6/1999 | Ochiai et al. . |
| 5,952,037 | 9/1999 | Nagayama et al. . |
| 5,962,970 | * 10/1999 | Yokoi et al. ......................... 313/506 |
| 6,121,727 | 9/2000 | Kanai et al. . |
| 6,221,563 | * 4/2001 | Hryhorenko et al. ............... 430/315 |

FOREIGN PATENT DOCUMENTS

| | | |
|---|---|---|
| 5-275172 | 10/1993 | (JP) . |
| 8-315981 | 11/1996 | (JP) . |

* cited by examiner

Primary Examiner—John A. McPherson
(74) Attorney, Agent, or Firm—Oblon, Spivak, McClelland, Maier & Neustadt, P.C.

(57) ABSTRACT

Provided is an organic electroluminescent device having a deposition-preventing layer formed with accuracy therein to have a predetermined profile. The deposition-preventing layer facilitates sure microfabrication in producing the device. The radiative recombination probability in the non-selected area of the organic luminescent layer in the device is greatly reduced. The device has a substrate, a first electrode layer overlying said substrate, a first deposition-preventing layer partly overlying said first electrode layer and forming at least a portion of boundaries of an active area of said electroluminescent device and an organic luminescent layer and a second electrode layer formed in that order overlying said first electrode layer within said active area. To form the deposition-preventing layer, used is a photosensitive resin composition which comprises:

i) a polymerizable compound; and
ii) a photoinitiator having an initiation wavelength $\lambda$, wherein said photosensitive resin composition has a reduced transmission of light of wavelength $\lambda$.

33 Claims, 6 Drawing Sheets

ORGANIC ELECTROLUMINESCENT DEVICE COMPRISING A PATTERNED PHOTOSENSITIVE COMPOSITION AND A METHOD FOR PRODUCING SAME

BACKGROUND OF THE INVENTION

1. Field of the Invention

The present invention relates to an organic electroluminescent device comprising isolation regions, a method for producing same, a method of patterning a photosensitive resin composition and a photolithographic system. Precisely, the invention relates to a thin-film type, organic electroluminescent device in which the luminescent layer comprises an organic compound and which emits light when an electric field is applied to its luminescent layer, and also relates to a method for fabricating the device in which the microfabrication step is specifically improved. In addition, the invention relates to a method of patterning a photosensitive resin composition, in which the photosensitive resin composition has a reduced transmission of light at the wavelength of photoinitiation.

2. Discussion of the Background

Heretofore, it has been common that thin-film type electroluminescent (EL) devices are made of inorganic materials which are obtained by doping a semiconductor of a Group III-V compound such as ZnS, CaS or SrS with Mn or a rare earth element (such as Eu, Ce, Tb, Sm) that serves as a radiative recombination center. However, the EL devices made of such inorganic materials have the following problems:

1) Alternate current drive is required (50 to 1000 Hz),

2) The driving voltage is high (generally about 200 V),

3) It is difficult to obtain full coloring (particularly, blue color), and

4) Costs of peripheral driving circuits are high.

However, in order to overcome the above problems, there have been activities, in recent years, to develop EL devices comprising thin organic films. Particularly, the light emission efficiency has been improved to a large extent over conventional EL devices employing a single crystal of e.g. anthracene, by the development of an organic EL device wherein the electrode material has been optimized for the purpose of improving the efficiency for carrier injection from the electrode in order to increase the light emission efficiency, and an organic hole transport layer made of an aromatic diamine and an organic luminescent layer made of an aluminum complex of 8-hydroxyquinoline, are provided (Appl. Phys. Lett., Vol. 51, p. 913, 1987). The light emission efficiency of the developed organic EL device is being on the practicable level.

Some methods have been tried for patterning the organic EL device.

One method comprises forming an anode film (or a cathode film) on a substrate, followed by forming thereon an organic luminescent layer (in this step, an organic hole transport layer and others are optionally formed). In this, a cathode film (or an anode film) is superposed on the organic luminescent layer through vacuum vapor deposition or the like using a shadow mask. In the organic EL device thus fabricated, a selected area between the anode and the cathode emits light but the other non-selected area does not. Therefore, the organic EL device can be so designed that the desired area therein can emit light.

Another method of using a resist has been tried, which comprises forming a luminescent layer through oblique incident deposition around a patterned resist wall (deposition-preventing layer) previously formed prior to the luminescent layer deposition (Japanese Patent Laid-Open No. 275172/1993). Still another method of using a resist has been tried, which comprises forming an additional overhanging layer to cover the resist pattern, or specifically processing the resist pattern to make it have a reverse-tapered cross-section profile, prior to forming the luminescent layer (Japanese Patent Laid-Open No. 315981/1996).

U.S. Pat. No. 5,294,869 discloses an organic EL device comprising a wall structure.

JP 8-315981 discloses an organic EL device in which an overhanging shape of a wall structure is formed from a plurality of layers.

JP 3-250583 discloses the formation of a wall structure.

Of the conventional patterning methods for fabricating organic EL devices, the method of using a shadow mask is problematic in that it requires accurate positioning of the substrate and the mask to the level of $\mu$m in the chamber of the vacuum device, and the positioning operation is not easy. Another problem with the method is that the substance adhered to the mask forms a thick film thereon in the course of repeated deposition whereby the pattern of the mask becomes dull.

Of the conventional methods, the patterning method of oblique incident deposition is favorable to fabricating small-sized devices, but for large-sized devices, the method requires a large space for the substrate. In addition, in the method, the thickness of the film formed will differ between the source side and the opposite side on the substrate, and fine patterning is impossible in the method. The problem with this other conventional patterning method where the resist is covered with an additional overhanging layer or is specifically processed to have a reverse-tapered cross-section profile, is that the method requires complicated steps for forming the overhanging layer or for specifically processing the resist. In addition, the reproducibility of the intended taper profile in the method is low, and the method is therefore expensive.

Ochai et al. U.S. Pat. No. 5,916,713 discloses a photopolymerizable composition for a color filter comprising a (meth)acrylate, a photopolymerization initiator and a colorant.

Urano et al. U.S. Pat. No. 5,800,952 discloses a photopolymerizable composition for a color filter comprising a compound having at least one ethylenically unsaturated double bond, a photopolymerization initiator system, a colorant and a phosphoric (meth)acrylate compound and/or an organic carboxylic anhydride.

Urano et al. U.S. Pat. No. 5,863,678 discloses a photopolymerizable composition for a color filter comprising a compound having at least one ethylenically unsaturated double bond, a photopolymerization initiator system and a red, green or blue colorant.

Takasaki et al. U.S. Pat. No. 5,914,206 discloses a color filter having a resin black matrix on a transparent substrate.

Accordingly, the first object of the invention is to address problems with the conventional methods noted above and to provide an organic EL device with the radiative recombination probability in the non-selected area of the organic luminescent layer in the device being greatly reduced, for which a deposition-preventing layer having a predetermined profile is formed with accuracy to facilitate and ensure micro-patterning in fabricating the device.

On the other hand, the deposition-preventing layer in the conventional organic EL devices is to electrically isolate the element cells from each other, and is therefore made of an electric insulator. Accordingly, on the substrates of the devices, an insulator serving as the deposition-preventing layer is disposed in stripes or lattices. As a result, in the pre-treatment step to be effected after the deposition-preventing layer has been formed and before a luminescent layer is formed, or in the step of forming a metallic electrode film layer, the electrically insulating area of the deposition-preventing layer is charged up thereby interfering with the pre-treatment operation or the electrode film deposition. For example, the deposition-preventing layer of an insulator formed on the surface of a substrate is charged up during ordinary pre-treatment of plasma processing with a mixed gas of argon and oxygen, thereby often causing abnormal plasma discharging, with the result that the layer is partly broken to increase the probability of failed devices. On the other hand, where a metallic electrode film is formed through sputtering with high productivity after the formation of the deposition-preventing layer, the deposition-preventing layer is also charged up, thereby having some negative influences on the sputtering operation, with the result that the abnormally sputtered film will be uneven also to increase the probability of failed devices.

Accordingly, the second object of the invention is to address problems with the conventional EL devices in which the deposition-preventing layer formed is readily charged up in the course of the subsequent steps of forming the other element layers thereon, and to provide a high-performance organic EL device with few defects, for which the deposition-preventing layer formed in the device is so controlled that it is not charged up so as not to cause abnormal discharging or abnormal sputtering in the subsequent steps of forming the other element layers thereon, thereby increasing the good yield of high-quality devices with few defects.

SUMMARY OF THE INVENTION

A first aspect of the invention is to provide an organic EL device which comprises a substrate, a first electrode layer overlying said substrate, a deposition-preventing layer partly overlying said first electrode layer and forming at least a portion of boundaries of an active area of the organic electroluminescent device, and an organic luminescent layer and a second electrode layer formed in that order overlying said first electrode layer within the active area, wherein said deposition-preventing layer is formed by irradiation of a photosensitive resin composition comprising a photosensitive resin composition having a reduced transmission of light of wavelength $\lambda$ comprising a polymerizable compound; and a photoinitiator having an initiation wavelength $\lambda$.

Another aspect of the invention is a method for producing an organic EL device comprises forming a first electrode layer overlying a substrate, then forming a deposition-preventing layer partly overlying said first electrode layer and forming at least a portion of boundaries of an active area of the organic electroluminescent device by photo-curing a photosensitive resin composition on said first electrode layer, and thereafter forming an organic luminescent layer and a second electrode layer in that order overlying said first electrode layer within the active area, wherein said deposition-preventing layer is formed by irradiation of a photosensitive resin composition wherein said photosensitive resin composition has a reduced transmission of light of wavelength $\lambda$ comprising a polymerizable compound; and a photoinitiator having an initiation wavelength $\lambda$.

Another aspect of the invention is to provide an organic EL device which comprises a substrate, a first electrode layer overlying said substrate, a deposition-preventing layer partly overlying said first electrode layer and forming at least a portion of boundaries of an active area of the organic electroluminescent device, and an organic luminescent layer and a second electrode layer formed in that order overlying said first electrode layer within the active area and which is characterized in that the resistivity of the deposition-preventing layer falls between $1\times10^{12}$ and $1\times10^{4}$ $\Omega\cdot cm$.

Another aspect of the invention is a method for producing an organic EL device comprises forming a first electrode layer overlying a substrate, then forming a deposition-preventing layer partly overlying said first electrode layer and forming at least a portion of boundaries of an active area of the organic electroluminescent device and thereafter forming an organic luminescent layer and a second electrode layer in that order overlying said first electrode layer within the active area, wherein the resistivity of the deposition-preventing layer falls between $1\times10^{12}$ and $1\times10^{4}$ $\Omega\cdot cm$.

Another aspect of this invention is a display comprising an organic electroluminescent device, a control circuit and a power source.

Another aspect of this invention is a method of patterning a photosensitive resin composition wherein said photosensitive resin composition has a reduced transmission of light of wavelength $\lambda$ comprising a polymerizable compound; and a photoinitiator having an initiation wavelength $\lambda$.

Another aspect of this invention is to provide a photolithographic system comprising a photosensitive resin composition having a reduced transmission of light of wavelength $\lambda$ comprising a polymerizable compound; and a photoinitiator having an initiation wavelength $\lambda$.; and a source of irradiation having wavelength $\lambda$.

These and other aspects of the present invention are made possible by the discovery that a photosensitive resin composition having a reduced transmission of light of wavelength $\lambda$ comprising a polymerizable compound; and a photoinitiator having an initiation wavelength $\lambda$ can be patterned to have a sidewall profile having an angle smaller than 90°.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein:

FIG. 1A is a cross-sectional view of the device; FIG. 1B is a cross-sectional view, illustrating the cross section of the device cut in the direction vertical to the cross section of FIG. 1A; and FIG. 1C is a plan view of the device.

DETAILED DESCRIPTION OF THE INVENTION

Figure 1:
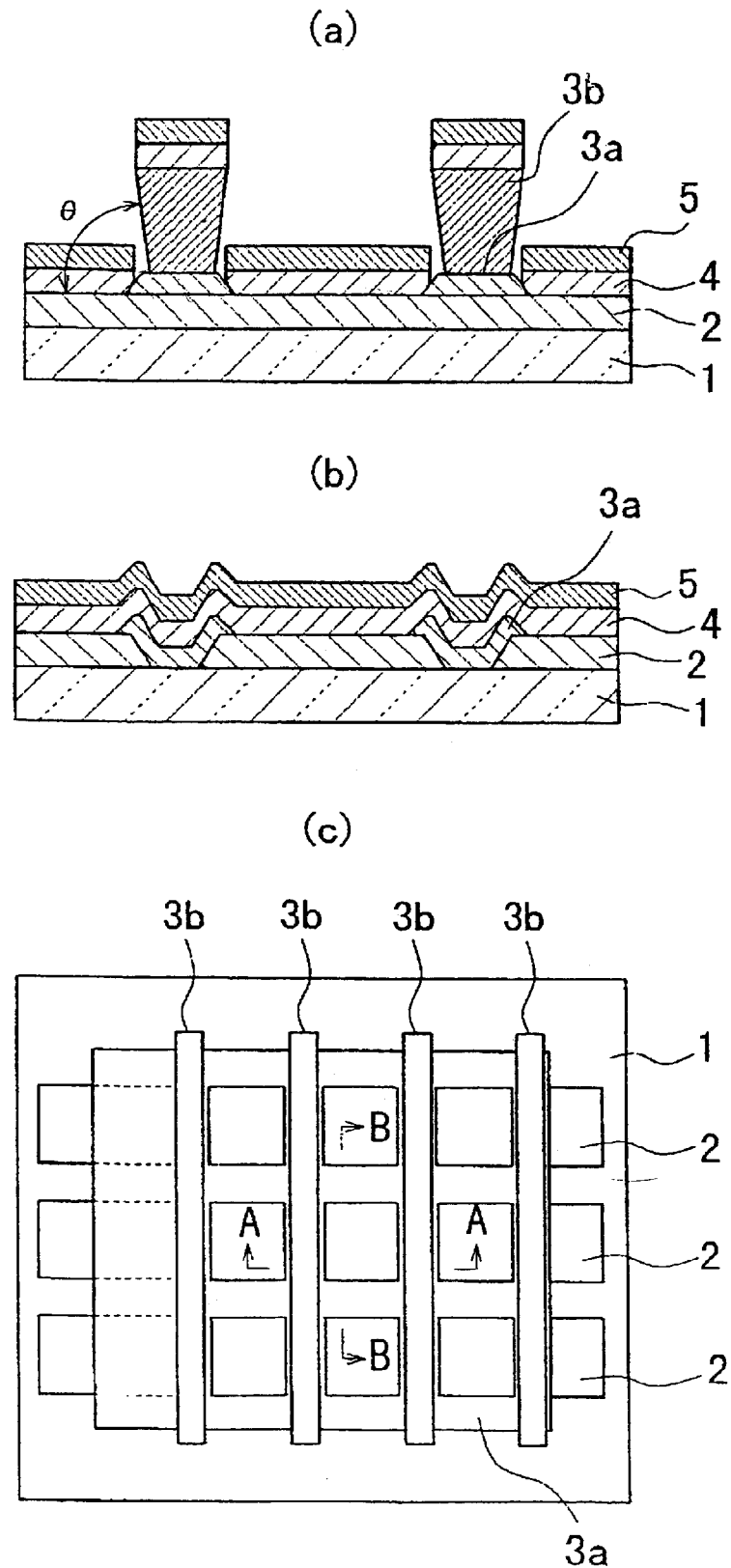
FIG. 1A to FIG. 1C are schematic views illustrating one embodiment of the organic EL device of the invention.

In the invention, the wavelength of the light to which the resist is exposed so as to be patterned into a deposition-preventing layer is selected, and the light intensity arriving in the direction of the depth of the resist is controlled so as to ensure easy, secure and accurate formation of the deposition-preventing layer having a desired cross-section profile in any desired pattern, and, as a result, the organic luminescent layer and the electrode layer can be formed with accuracy in the subsequent step. Accordingly, in the organic EL device of the invention, the element layers thus formed are surely electrically separated from each other, and the radiative recombination probability in the non-selected area is greatly reduced.

Concretely, in the invention, the photosensitive resin composition for forming the deposition-preventing layer has a reduced transmission of light of wavelength 80 a comprises a polymerizable compound; and a photoinitiator having an initiation wavelength $\lambda$. This may be achieved through the presence of a substance not promoting the photo-curing of the composition and which inhibits transmission of the photo-curing light applied to the composition. The substance is hereinafter referred to as "transmission inhibiting substance".

Accordingly, the cross-section profile of the deposition-preventing layer to be formed, or that is, the angle made by the side of the layer and the surface of the substrate can be controlled in any desired manner by controlling the following:

(1) the degree of transmission of light of wavelength $\lambda$ of the photosensitive resin composition; and (2) the distance between the mask via which the photosensitive resin composition to be patterned is exposed to light, and the surface of the film of the composition.

Further in the invention, it is easy to vary the cross-section profile of the deposition-preventing layer into different ones even in the same mask exposure combined with the same development process to be effected under the same condition, merely by varying only the amount of the transmission inhibiting substance contained in the photosensitive resin composition and by varying the distance between the exposure mask and the surface of the film of the composition without changing the essential component, the photo-polymerizing composition to be in the resin composition. Therefore, in the invention, it is easy to form two or more deposition-preventing layers each having a different cross-section profile in different patterns in one organic EL device. Combining the deposition-preventing layers all having an optimum profile in the optimum pattern makes it possible to form much finer organic electroluminescent layers and much finer electrode layers, thereby much more reducing the radiative recombination possibility in the non-selected area in the device.

Preferably, the photosensitive resin composition for use in the invention comprises, a photo-polymerizing resin composition that contains a photo-polymerization initiator capable of generating radicals by absorbing light of wavelength $\lambda$, and a compound having at least one addition-polymerizing, ethylenic unsaturated double bond and capable of being polymerized by the action of the radicals, and a transmission inhibiting substance.

Also preferably, the deposition-preventing layer is composed of at least two layers including a first deposition-preventing layer of which the angle of the side to the surface of the substrate is smaller than 90° and a second deposition-preventing layer formed partially overlying the first electrode layer and between said first deposition-preventing layer in such a manner that the angle of its side to the surface of the substrate is greater than 90°.

In the invention, the deposition-preventing layer can be formed by depositing a photosensitive resin composition such as that mentioned above overlying a substrate having a first electrode layer formed thereon, and patterning it through exposure to light via a mask to thereby cure the exposed area of the photosensitive resin composition followed by removing the non-exposed area thereof through development. In this process, the photosensitive resin composition may contain a transmission inhibiting substance in an amount of from 0.01 to 20% by weight of the total solid content of the composition, and the distance between the surface of the film of the composition and the mask may fall between 10$\lambda$ and 1,000$\lambda$ relative to the wavelength $\lambda$ of the light to which the composition is exposed, whereby the angle of the side of the deposition-preventing layer formed to the surface of the substrate could be larger than 90°.

In another embodiment where the photosensitive resin composition contains a transmission inhibiting substance in an amount of from 1 to 90% by weight of the total solid content of the composition, and the distance between the surface of the film of the composition and the mask falls between 1$\lambda$ and 100$\lambda$ relative to the wavelength $\lambda$ of the light to which the composition is exposed, the angle of the side of the deposition-preventing layer formed to the surface of the substrate could be smaller than 90°.

Figure 2:
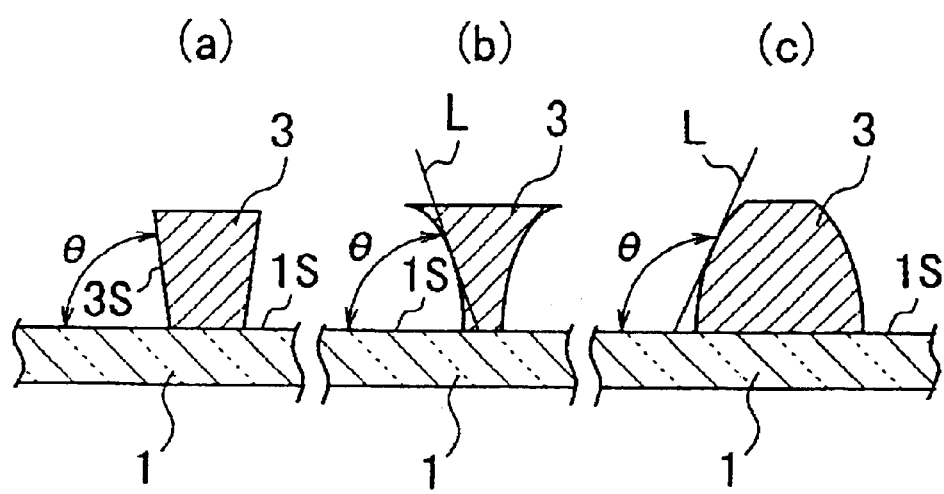
FIG. 2A to FIG. 2C are cross-sectional views to explain the tapered angle of the side of the deposition-preventing layer to the substrate.

In the invention, the angle formed by the side of the deposition-preventing layer and the surface of the substrate indicates the angle $\theta$ at which the side 3S crosses the surface 1S of the substrate 1, as in FIG. 2A, for the deposition-preventing layer 3 of which the side is nearly flat. On the other hand, for the deposition-preventing layer 3 having a concave side as in FIG. 2B, and for that having a convex side as in FIG. 2C, the angle of the side of the layer to the surface of the substrate is defined as the average angle at which the side of the layer crosses the surface of the substrate. Concretely, for the embodiments where the side of the deposition-preventing layer is curved as so illustrated in FIG. 2B and FIG. 2C, the angle between the side of the layer and the surface of the substrate shall be the angle $\theta$ at which the line L tangential to the side of the layer crosses the surface 1S of the substrate. The crossing angle between the side of the deposition-forming layer and the surface of the substrate will be hereinafter referred to as "tapered angle to the substrate". The profile of the deposition-preventing layer of which the angle of the side to the surface of the substrate is smaller than 90° and of which the side in its cross-section profile is inclined toward its overhanging side relative to the direction vertical to the surface of the substrate will be hereinafter referred to as "reverse-tapered profile"; while, on the contrary, the profile of the deposition-preventing layer of which the angle of the side to the surface of the substrate is larger than 90° will be as "normal-tapered profile".

DESCRIPTION OF THE PREFERRED EMBODIMENTS

An organic EL device according to the invention and a method for producing it are described in detail herein under with reference to the drawings attached hereto.

FIG. 1A to FIG. 1C are schematic views illustrating one embodiment of the organic EL device to be produced in the invention. Precisely, FIG. 1A is a cross-sectional view, illustrating the cross section of the device cut along the A—A line in FIG. 1C; FIG. 1B is a cross-sectional view, illustrating the cross section of the device cut in the direction vertical to the cross section of FIG. 1A, or that is, cut along the B—B line in FIG. 1C; and FIG. 1C is a plan view of the device in which, however, the organic layer and the second electrode layer are not shown.

In FIG. 1A to FIG. 1C, the numeral reference 1 indicates a substrate; 2 indicates an electroconductive layer serving as an anode; 3a indicates a second deposition-preventing layer; 3b indicates a first deposition-preventing layer; 4 indicates an organic layer composed of a hole transport layer and an organic luminescent layer formed in that order (this is hereinafter simply referred to as "organic layer"); and 5 indicates an electroconductive layer serving as a cathode.

In the organic EL device of the illustrated embodiment, the electroconductive layer 2 adjacent to the substrate serves as an anode, acting as hole injection layer.

The substrate 1 is the support of the organic EL device of the invention, for which are used, for example, quartz or glass plates, metal plates or foil, or plastic films or sheets, etc. Preferred are glass plates, as well as transparent synthetic resin substrates of polyesters, polymethacrylates, polycarbonates, polysulfones, polycyclohexylethylene etc.

On the substrate 1, formed is the electroconductive layer 2. In general, the electroconductive layer 2 is made of a metal such as aluminum, gold, silver, nickel, palladium, tellurium, etc.; a metal oxide such as indium and/or tin oxide, etc.; copper iodide; carbon black; an electroconductive polymer such as poly(3-methylthiophelene), or the like. The electroconductive layer 2 serving as an anode may be formed by conventional methods known to those of ordinary skill in the art, such as through sputtering, vacuum vapor deposition or the like in many cases. Where fine particles of a metal such as silver, or copper iodide, carbon black, fine particles of an electroconductive metal oxide, or fine powder of an electroconductive polymer or the like are used, they are dispersed in a suitable binder resin, and the resulting dispersion may be coated on the substrate to form the layer 2. The layer 2 of an electroconductive polymer may also be formed by directly forming a thin film of the polymer on the substrate through electrolytic polymerization thereon, or by coating the polymer on the substrate (Appl. Phys. Lett., Vol. 60, p. 2711, 1992). The electroconductive layer 2 may have a laminate structure comprising 2 or more layers of different substances. The thickness of the layer 2 varies, depending on the necessary transparency thereof. For the transparent layer 2, it is desirable that the layer 2 has a visible light transmittance of at least 60%, more preferably at least 80%. In this case, the thickness of the layer 2 may fall generally between 5 and 1,000 nm or so, but preferably between 10 and 500 nm or so.

For the opaque layer 2 serving as an anode, the material to form the layer 2 may be the same as that to form the substrate 1. The electroconductive layer may have a laminate structure comprised of a plurality of layers of different substances.

On the other hand, the electroconductive layer 5 may serve as a cathode, playing a role of electron injection into the organic layer 4. The material to form the electroconductive layer 5 may be the same as that to form the electroconductive layer 2. However, for securing efficient electron injection, a metal having a low work function is desired for the layer 5. Generally used are suitable metals including, for example, tin, magnesium, indium, aluminum, silver and the like, or their alloys. The electroconductive layer 5 may also have a laminate structure comprising 2 or more layers of different substances. As a general rule, the thickness of the electroconductive layer 5 may be substantially the same as that of the electroconductive layer 2. However, for good EL devices, it is desirable that at least one of the electroconductive layers 2 and 5 has have high transparency. Therefore, it is preferable that one or both of the electroconductive layers 2 and 5 have a thickness falling between 10 and 500 nm or so and have high transparency. In a preferred embodiment, the electroconductive layer 2 is formed in parallel rows on the surface of the substrate 1. The deposition of the electroconductive layer 2, in a pattern of parallel rows, is within the level of skill of those of ordinary skill in the art, without undue experimentation, such as by depositing a layer and etching.

The deposition-preventing layers 3a and 3b which are overlying said electroconductive layer 2 of an anode may be any ones, so far as their resistivity is sufficiently higher than that of the organic layer 4.

However, depending on their object, the thickness of the layers 3a and 3b and also the tilt angle of their sides to the substrate, or that is, the tapered angle of their sides to the substrate may be independently suitably controlled.

Specifically, in the embodiment illustrated in FIGS. 1A to 1C, the second deposition-preventing layer 3a is formed in lattices as in the plan view, and its first object is to prevent the area around the edges of the electroconductive layer 2 from being uneven while the layer 2 is patterned, and to remove the influence of the uneven area around the element cells of the organic layer 4 and the electroconductive layer 5 on the layers 4 and 5 while the layers 4 and 5 are formed, thereby ensuring uniform light emission in the luminescent region in the device. For this, it is desirable that the thickness of the second deposition-preventing layer 3a is not too large as compared with that of the organic layer 4 and the electroconductive layer 5 and that the cross section of the layer 3a has a normal-tapered profile. Adjustment of the thickness of the layer 3a, is within the level of skill of those of ordinary skill in the art, without undue experimentation. In the illustrated embodiment, the first deposition-preventing layer 3b is formed in stripes (parallel rows) overlying parallel rows of a lattice pattern of the second deposition preventing layer, and its first object is to separate the adjacent element cells of the organic layer 4 and the electroconductive layer 5 (these layers 4 and 5 are formed after the formation of the layer 3a) from each other owing to the difference in the height of the layer 3a from the layers 4 and 5. For this, it is desirable that the thickness of the first deposition-preventing layer 3b is not too small as compared with that of the organic layer 4 and the electroconductive layer 5 and that the cross section of the layer 3b has a reverse-tapered profile.

In a preferred embodiment, the first deposition preventing layer 3b is formed in parallel row overlying parallel rows of a portion of the second deposition preventing layer 3a, which is formed in a lattice pattern. The first deposition preventing layer 3b, alone or in combination with the second deposition preventing layer 3a form the boundaries of an active area of an electroluminescent device. Sequential layers of an organic luminescent layer 4 and a second electroconductive layer 5 (second electrode), in conduction with the first electroconductive layer 2 (first electrode) provide for an electroluminescent device within the boundaries defined by the first deposition preventing layer 3b, alone, or in combination with the second deposition preventing layer 3a.

The lattice pattern formed by the second deposition preventing layer 3a, is illustrated as forming lattice in which the rows and columns intersect at an angle of 90° (forming an element cell having a square shape). However, it will be appreciated that a lattice pattern may be formed in which the rows and columns intersect at an angle of from greater than 0° to 90° (forming an element cell having a shape of a parallelogram, in which both opposing sides are parallel to each other. It will also be appreciated that the lattice pattern forming the boundaries of the active area of an electroluminescent device may be formed from the first deposition layer 3b, alone or in combination with the second deposition preventing layer 3a.

In another embodiment, the first deposition preventing layer 3b is formed in parallel rows, which form an angle greater than 0°, preferably 90° relative to parallel rows of the first electrode layer 2. When viewed from above, the parallel rows of the first deposition preventing layer 3b and the parallel rows of the first electrode layer 2 will form lattice pattern in which the two sets of parallel rows intersect at an angle of from greater than 0° to 90°, forming a shape of a parallelogram, preferably the two sets of parallel rows intersect at an angle of 90°, forming the shape of a square.

The technology describe herein is useful for forming display devices of the passive and active types.

FIG. 1C illustrates the first deposition preventing layer 3b, formed in parallel rows overlying parallel rows of the lattice of the second deposition preventing layer 3a. This configuration is preferred for a display device of the passive matrix type, where a plurality of individual cells are addressed in series. For a display device of the active matrix type, individual cells are addressed separately, however, it is possible to form the first deposition preventing layer 3b, and the second deposition preventing layer 3a.

Preferably, the thickness of the second deposition-preventing layer 3a falls between 0.1t and 10t, more preferably between 0.5t and 5t, t indicating the total thickness of the organic layer 4 and the electroconductive layer 5. If the second deposition-preventing layer 3a is too thin, such is unfavorable since the electric insulation of the electroconductive layer 2 from the electroconductive layer 5 will be small. On the contrary, if the layer 3a is too thick, such is also unfavorable. This is because, when the electroconductive layer 5 overhangs the second deposition-preventing layer 3a, as in FIG. 1B, and when the layer 3a is too thick, the layer 5 will be thinned around the edge area of the layer 3a whereby the resistivity of the layer 5 in that area will be high.

The cross section of the second deposition-preventing layer 3a has a normal-tapered profile of such that the side of the layer 3a is gently inclined toward the surface of the substrate 1 at an angle larger than the vertical angle to the surface of the substrate 1, and the degree of the inclination of the side of the layer 3a preferably falls between 91° and 170°, more preferably between 120° and 150°, in terms of the tapered angle θ relative to the substrate 1, as in FIG. 1A or FIG. 2C. If the angle θ is too small, such is unfavorable since the electroconductive layer 5 will electrically break down. On the contrary, if the angle θ is too large, such is also unfavorable since the deposition-preventing film area will be too large whereby the luminescent region (aperture) of the EL device will be relatively reduced.

Within the context of the present invention, it is not necessary for the second deposition-preventing layer 3a to be formed by irradiation of a photosensitive resin composition having a transmission inhibiting substance or for the composition to have a reduced transmission of irradiation light. A normal taper (having an ∠ greater than 90°) may be formed in the absence of a transmission inhibiting substance or having a reduced transmission of irradiation light. Formation of a normal taper may be favored by adjusting the distance of the photolithography mask and the surface of a layer of photosensitive resin composition to be from 10λ to 1,000 λ, relative to the wavelength λ of the light of irradiation. However, for performance purposes, it can be desirable for the conductivity of the first deposition-preventing layer to falls between $1\times10^{12}$ and $1 \times10^4$ Ω·cm and/or for the first deposition-preventing layer to have a reduced transmission of visible light. This may be achieved through the presence of a conductive material, such as carbon black or metal powders, present in an amount to provide a conductivity of between $1\times10^{12}$ and $1\times10^4$ Ω·cm and/or for the first deposition-preventing layer to have a reduced transmission of visible light. The amount of carbon black or metal powder needed to achieve these result may be determined by those of ordinary skill in the art by routine experimentation.

On the other hand, it is desirable that the thickness of the first deposition-preventing layer 3b falls between 2t and 200t, more preferably between 5t and 50t, t indicating the total thickness of the organic layer 4 and the electroconductive layer 5.

If the first deposition-preventing layer 3b is too thin, such is unfavorable. This is because when the electroconductive layer 5 overhangs the first deposition-preventing layer 3b and when the layer 3b is too thin, the adjacent element cells of the layer 5 could not be separated from each other to a satisfactory degree. On the contrary, if the layer 3b is too thick, such is also unfavorable since the layer 3b readily falls down, making it difficult to complete the fabrication of the device.

The cross section of the first deposition-preventing layer 3b has a reverse-tapered profile of such that the side of the layer 3b is inclined toward its overhanging direction relative to the direction vertical to the surface of the substrate 1, and the degree of the inclination of the side of the layer 3b preferably falls between 30° and 89°, more preferably between 45° and 80°, in terms of the tapered angle θ relative to the substrate 1, as in FIG. 1A or FIG. 2A. If the angle θ is too small, such is unfavorable since the layer 3b readily falls down, making it difficult to complete the fabrication of the device. On the contrary, if the angle θ is too large, such is also unfavorable. This is because when the electroconductive layer overhangs the first deposition-preventing layer 3b and when the angle θ is too large, the adjacent element cells of the layer 5 could not be separated from each other to a satisfactory degree.

In a preferred embodiment, the first deposition-preventing layer has a reverse-taper profile, the portion providing the reverse-taper profile being made from a single layer of polymerized photosensitive resin composition.

In a preferred embodiment, the first deposition-preventing layer has a reverse-taper profile, the portion providing the reverse-taper profile having no detectable interface therein.

In the invention, at least the deposition-preventing layer 3b is formed from a photosensitive resin composition that has a reduced transmission of initiation light, such as might result from the presence of a transmission inhibiting substance which does not participate in photo-curing.

The photosensitive resin composition used in the present invention has a reduced transmission of light at the wavelength of irradiation. This may be achieved by the presence of a separate transmission inhibiting substance or through the presence of a transmission inhibiting group on the polymerizable compound. In the practice of the present invention, the wavelength of light transmission which is inhibited is related to the wavelength of light of photo-polymerization initiation, which is related to the wavelength of activation of the photo-polymerization initiator. By reducing the transmission of light at the wavelength of photo-polymerization, the effects of diffraction around a mask can be reduced and provide for a patterned film having a profile angle, relative to the substrate, which is smaller than 90°.

A photosensitive resin composition will have a reduced transmission of light at the wavelength of irradiation if light of the wavelength of irradiation is absorbed and/or reflected. When light of the irradiation wavelength passes through the photosensitive resin composition having a path length l, the transmission of light is reduced at least 10%, preferably at least 20%, more preferably at least 30%, even more preferably at least 40%, relative to a photosensitive resin composition in the absence of a transmission inhibiting substance and/or group.

Another way to determine if a photosensitive resin composition has a reduced transmission of light at the wavelength of irradiation, is by the presence of a gradient distribution of radicals when a film of photosensitive resin composition is irradiated, the concentration of radicals decreasing in the direction away from the surface of the film being irradiated.

Yet another way to determine if a photosensitive resin composition has a reduced transmission of light at the wavelength of irradiation, is by the presence of a gradient distribution of molecular weight when a film of photosensitive resin composition is irradiated, the average molecular weight of the polymer increasing in the direction away from the surface of the film being irradiated. When the photosensitive resin composition is polymerized by the action of a cross-linking monomer, it can be difficult to use this molecular weight based method to determine a reduced transmission of light at the wavelength of irradiation.

In addition to inhibiting the transmission of light at the wavelength of photo-polymerization (photo-curing), the transmission inhibiting substance and/or the transmission inhibiting group should not contribute to the photo-polymerization of the photosensitive resin composition. A substance and/or group is considered to not promote the photo-curing of the composition if the number of radical initiations is not increased due to the presence of the substance and/or group. This can be measured indirectly by measuring the average molecular weight of a photosensitive composition, in the presence of a non photo-curing promoting substance and/or group, the average molecular weight, not being lower in the presence of a non photo-curing promoting substance and/or group.

Another way to determine if a substance and/or group contributes to the photo-polymerization of the photosensitive resin composition is by irradiation of a composition comprising a polymerizable compound, such as an ethylenically unsaturated compound, and a substance which does not contribute to photo-polymerization, in the absence of a separate photo-polymerization initiator. In the absence of a contribution to photo-polymerization being made by the substance, little or no polymer would be formed. This can easily be determined by irradiation through a mask, of a layer of a polymerizable compound, and a substance which does not contribute to photo-polymerization, followed by developing. The absence of a pattern corresponding to the mask pattern is evidence that the substance does not contribute to the photo-polymerization of the composition.

Preferably, the photo-polymerizing resin composition comprises a photo-polymerization initiator capable of generating radicals by absorbing light of wavelength $\lambda$, and a compound having at least one addition-polymerizable, ethylene unsaturated double bond and capable of being polymerized by the action of the radicals (the compound is hereinafter referred to as "ethylenic compound"). More preferably, an organic polymer substance serving as a binder is added to the composition for improving the miscibility, the film-forming ability, the developability and the adhesiveness of the composition.

The photo-polymerization initiator includes, for example, a UV-sensitive photo-polymerization initiator capable of generating radicals by absorbing UV rays, and a visible light-sensitive photo-polymerization initiator capable of generating radicals by absorbing visible light. Examples of the UV-sensitive photo-polymerization initiator are dialkylacetophenones, benzyldialkyl ketals, benzoins, benzoin alkyl ethers, thioxanthone derivatives, acylphosphine oxides and the like such as those described in Fine Chemical, Vol. 120, No. 4, pp. 16–26 (Mar. 1, 1991); as well as hexaarylbiimidazoles, S-trihalomethyltriazines and the like such as those described in Japanese Patent Laid-Open No. 40302/1983 and Japanese Patent Publication No. 37377/1970.

Examples of the visible light-sensitive photo-polymerization initiator that is sensitive to visible light of from 400 nm to 500 nm in wavelength are combinations of hexaarylbiimidazoles and radical generators with colorants (Japanese Patent Publication No. 37377/1970); combinations of hexaarylbiimidazoles and (p-dialkylaminobenzylidene)ketones (Japanese Patent Laid-Open Nos. 2528/1972, 155292/1979); combinations of cyclic cis-α-dicarbonyl compounds and colorants (Japanese Patent Laid-Open No. 84183/1973); combinations of substituted triazines and merocyanine dyes (Japanese Patent Laid-Open No. 151024/1979); combinations of ketocoumarins and activators (Japanese Patent Laid-Open Nos. 112681/1977, 15503/1983, 88005/1985); combinations of substituted triazines and sensitizers (Japanese Patent laid-Open Nos. 29803/1983, 40302/1983); combinations of biimidazoles, styrene derivatives and thiols (Japanese Patent Laid-Open No. 56403/1984); combinations of dialkylaminophenyl group-having sensitizers and biiumidazoles (Japanese Patent Laid-Open Nos. 69/1990, 168088/1982, 107761/1993, 210240/1993, 288818/1992); combinations of organic peroxides and colorants (Japanese Patent Laid-Open Nos. 140203/1984, 189340/1984); titanocenes serving as a photo-polymerization initiator (Japanese Patent Laid-Open Nos. 152396/1984, 151197/1986, 10602/1988, 41484/1988, 291/1990, 12403/1991, 20293/1991, 27393/1991, 52050/1991); combinations of titanocenes and xanthene dyes with amino or urethane group-having, addition-polymerizing, ethylenic unsaturated double bond-having compounds (Japanese Patent Laid-Open Nos. 221958/1992, 219756/1992), etc.

The ethylenic compound may be any of monomers or polymers having ethylenic unsaturated double bond(s) in the side chains or in the main chain. The terminology "monomer" as referred to herein is meant to indicate the broad concept of "monomer" relative to the terminology of "high-molecular substance", without being limited to only so-called monomers in the narrow sense of the word, and therefore it shall include not only monomers but also dimers, trimers and other oligomers.

The ethylenic compound includes, for example, unsaturated carboxylic acids, esters of unsaturated carboxylic acids with $C_{2-20}$ aliphatic polyhydroxy compounds, esters of unsaturated polycarboxylic acids with $C_{6-24}$ aromatic polyhydroxy compounds, and also esters to be obtained through esterification of unsaturated carboxylic acids and polycarboxylic acids with polyhydroxy compounds such as $C_{2-10}$ aliphatic polyhydroxy compounds, $C_{6-18}$ aromatic polyhydroxy compounds, etc.

Of those, examples of the esters of unsaturated carboxylic acids with aliphatic polyhydroxy compounds are acrylates such as ethylene glycol diacrylate, triethylene glycol diacrylate, trimethylolpropane triacrylate, trimethylolethane triacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, glycerol aciylate, etc.; as well as their derivatives where the acrylate moiety is substituted with any other ester moiety, such as methacrylates having a methacrylate moiety, itaconates having an itaconate moiety, crotonates having a crotonate moiety, maleates having a maleate moiety, etc.

Non-limiting examples of the esters of unsaturated carboxylic acids with aromatic polyhydroxy compounds are hydroquinone diacrylate, hydroquinone dimethacrylate, resorcinol diacrylate, resorcinol dimethacrylate, pyrogallol triacrylate, etc.

The esters to be obtained through esterification of unsaturated carboxylic acids and polycarboxylic acids with polyhydroxy compounds are not always single compounds. Specific examples of the esters are condensates of acrylic acid, phthalic acid and ethylene glycol; condensates of acrylic acid, maleic acid and diethylene glycol; condensates of methacrylic acid, terephthalic acid and pentaerythritol; condensates of acrylic acid, adipic acid, butanediol and glycerin, etc.

The photo-polymerizing composition for use in the invention may contain an organic polymer substance serving as a binder. Non-limiting examples of the polymer substance includes, for example, copolymers of alkyl (meth)acrylates such as methyl (meth)acrylate, ethyl (meth)acrylate, propyl (meth)acrylate, butyl (meth)acrylate, 2-ethylhexyl (meth) acrylate, hydroxyethyl (meth)acrylate, hydroxypropyl (meth)acrylate, benzyl (meth)acrylate, etc.; optionally-substituted phenyl (meth)acrylates such as hydroxyphenyl (meth)acrylate, methoxyphenyl (meth)acrylate, etc.; acrylonitrile; vinyl esters such as vinyl acetate, vinyl versatate, vinyl propionate, vinyl cinnamate, vinyl pivalate, etc.; styrene, a-methylstyrene, etc.; as well as polyethers of bisphenol A with epichlorohydrin; soluble nylons; polyvinyl alkyl ethers; polyamides; polyurethanes; polyethylene terephthalates or isophthalates; acetylcelluloses; polyvinylformals; polyvinylbuturals, etc. The wording "(meth)acryl" as referred to herein indicates "acryl or methacryl"; and the same shall apply to the wording "(meth)acrylate".

One characteristic feature of the invention is that the photosensitive resin composition to form the deposition-preventing layer in the organic EL device has a reduced transmission of initiation light, such as that resulting from the presence of a transmission inhibiting substance. The transmission inhibiting substance is meant to indicate a substance which inhibits transmission of the light applied to the photosensitive resin composition so as to cure the composition, but absorbing and/or reflecting the light. In addition, the substance does not promote the photo-polymerization of the photosensitive resin composition exposed to light, being different from the photo-polymerization initiator (e.g., radical generator, sensitizer, etc.) to be in the composition. The transmission inhibiting substance of that type includes, for example, dyes, pigments and metal powders, such as white pigments, fluorescent pigments and other pigments. Examples of dyes and pigments usable for the substance are Victoria Pure Blue (42595), Auramine O (41000), Cation Brilliant Flavine (basic 13), Rhodamine 6GCP (45610), Rhodamine B (45170), Safranine OK70:100 (50240), Erioglaucine X (42080), No. 120/Lyonol Yellow (21090), Lyonol Yellow GRO (21090), Simler Fast Yellow 8GF (21105), Benzidine Yellow 4T-564D (21095), Simler Fast Red 4015 (12355), Chrome Phthal Red, Lyonol Red 7B4401 (15850), Fastgen Blue TGR-L (74160), Lyonol Blue SM (26150), Phthalocyanine blue Mitsubishi Carbon Black M1000, Mitsubishi Carbon Black #40, Lyonol Blue ES (Pigment Blue 15:6), Lyonogen Red GD (Pigment Red 168), Lyonol Green 2YS (Pigment Green 36), etc. The numerals parenthesized in the above mean the color indices (C.I.).

Preferably, the transmission inhibiting substance is combined with an electroconductive substance which will be described herein under.

In consideration of the film-forming ability of the photosensitive resin composition and of the uniform dispersion of the transmission inhibiting substance, when in the form of a non-soluble material such as a pigment or metal powder, in the deposition-preventing layer of the composition, it is desirable that the transmission inhibiting substance is in the form of fine particles having a mean particle size of from 0.005 to 0.5 $\mu$m, more preferably from 0.01 to 0.3 $\mu$m.

In an alternative embodiment, a separate transmission inhibiting substance is only optionally included in the photosensitive resin composition. Inhibition of transmission of initiating light is achieved by the presence of a transmission inhibiting group attached to the ethylenic compound. The transmission inhibiting group does not promote the photo-curing of the composition, as described above for the transmission inhibiting substance. A suitable transmission inhibiting group may be attached to the ethylenic compound via an ester linkage of an unsaturated carboxylic acid ester or directly to the α-position of an unsaturated carboxylic acid ester. The functional density of the transmission inhibiting group is such as to inhibit transmission of photoinitiation light, 10–95%, preferably 20–90%, more preferably 30–80%, relative to a photosensitive resin composition which does not contain transmission inhibiting groups. In functional terms, the functional density of the transmission inhibiting group is such as to enhance the formation of a reverse-tapered profile, relative to a photosensitive resin composition which does not contain transmission inhibiting groups, when irradiated through a mask.

The photosensitive resin composition for use in the invention to form the deposition-preventing layer comprises, a photo-polymerizing composition. A non-limiting example is a composition comprising 100 parts by weight of an organic polymer substance, from 0.01 to 30 parts by weight of a photo-polymerization initiator and from 5 to 100 parts by weight of an ethylenic compound, and a transmission inhibiting substance, in which the transmission inhibiting substance accounts for from 0.01 to 90% by weight of the total solid content of the photosensitive resin composition.

According to the present invention the photosensitive resin composition may comprise customary additives, such as thermal polymerization inhibitors, plasticizers, surface protection agents, coating property-improving agents, film-forming agents, adhesiveness-improving agents, development improving agents, so long as such additives do not deteriorate the basic characteristics of the deposition preventing layer, especially in terms of electrical conductivity. The amount of each additive will depend on the ingredients of the photosensitive resin composition, however, the total amount of additives, will typically comprise less than 10% by weight of the total solids content of the composition.

A suitable photosensitive resin composition is described in U.S. Pat. No. 5,916,713, the relevant portions of which are hereby incorporated by reference.

In the invention, a film of the photosensitive resin composition is formed, then photo-cured through exposure to light, and thereafter developed to remove the non-exposed area of the film. In the process of processing the film of the composition, it is easy to form a layer having a normal-tapered cross-section profile like the second deposition-preventing layer 3a, and a layer having a reverse-tapered cross-section profile like the first deposition-preventing layer 3b, as will be described herein under.

Preferably, the deposition-preventing layer has a resistivity falling between $1\times10^{12}$ and $1\times10^4$ Ω·cm, and more preferably between $1\times10^{12}$ and $1\times10^4$ Ω·cm. This is because, if so, the layer can be less charged up, causing less luminescent cell separation failure, as will be described herein under.

The process for forming the deposition-preventing layer having a normal-tapered cross-section profile and that for forming the deposition-preventing layer having a reverse-tapered cross-section profile are described below, with reference to FIG. 3 and 4, respectively.

Figure 3:
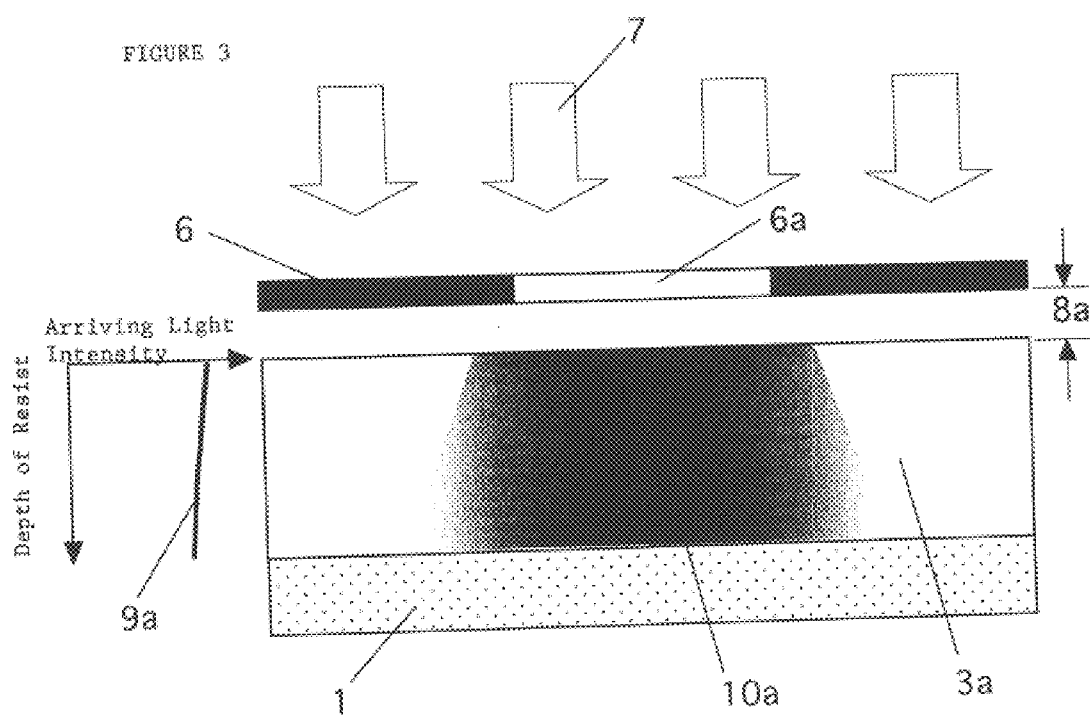
FIG. 3 is a schematic view illustrating the formation of a deposition-preventing layer having a normal-tapered cross-section profile.

(1) Process for forming a deposition-preventing layer having a normal-tapered cross-section profile:

FIG. 3 is a schematic view illustrating the formation of a deposition-preventing layer having a normal-tapered cross-section profile. When forming a layer having a normal-tapered cross-section, it is not necessary for the photosensitive resin to have a reduced transmission of initiation light, such as by the presence of a transmission inhibiting substance.

In FIG. 3, the reference numeral 6 indicates a mask via which a deposition-preventing layer is patterned; and 6a indicates a window for passing light therethrough. 7 indicates light applied to the photo-polymerizing resin (negative resist) 10A; and D indicates the gap distance between the mask 6 and the resist 10A to be a deposition-preventing layer. Also in FIG. 3, the graph on the left side is to schematically show the distribution of the light intensity arriving in the direction of the depth of the resist 10A. Where the transmission inhibiting substance content of the resist 10A is relatively small, the arriving light intensity is distributed relatively uniformly in the direction of the depth of the resist 10A, as indicated by the curve 9A in FIG. 3. In FIG. 3, 10a is to schematically indicate the condition of the light having arrived in the resist 10A. The dark area 10a has received intense light. The reason why the area 10a has a trapezoidal shape, as in FIG. 3 illustrating the condition of the light having arrived in the resist 10A, is because the transmission inhibiting substance content of the resist 10A is small, and because the gap distance D is large relative to the wavelength of the light applied to the resist 10A, thereby causing significant light diffusion in the resist 10A owing to the light diffraction occurring around the edge area of the light-passing window 6a of the mask 6.

The transmission inhibiting substance is an optional component for forming a normal-tapered cross-section, and when present content of the resist 10A typically falls between 0.01 and 20% by weight of the total solid content of the photosensitive resin composition, more preferably between 0.1 and 10% by weight; and also preferably the gap distance D falls between 10λ and 1,000λ, more preferably between 50λ and 200λ, relative to the wavelength λ of the light applied to the resist 10A. In that condition, the cross section profile of the resist 10A in which the radiated light has arrived can have a trapezoidal shape, as so indicated by 10a in FIG. 3. The trapezoidal area of the resist 10A in which the radiated light has arrived is thus photo-cured, and then the non-exposed area of the resist 10A is removed through development. As a result, only the cured part of the resist 10A, of which the cross-section profile is like the shape of 10a in FIG. 3, remains on the substrate 1 to be thereon a deposition-preventing layer having a normal-tapered cross-section profile.

The transmission inhibiting substance, preferably functions as a conductive substance to adjust the resistivity to fall between $1\times10^{12}$ and $1\times10^4$ Ω·cm.

Figure 4:
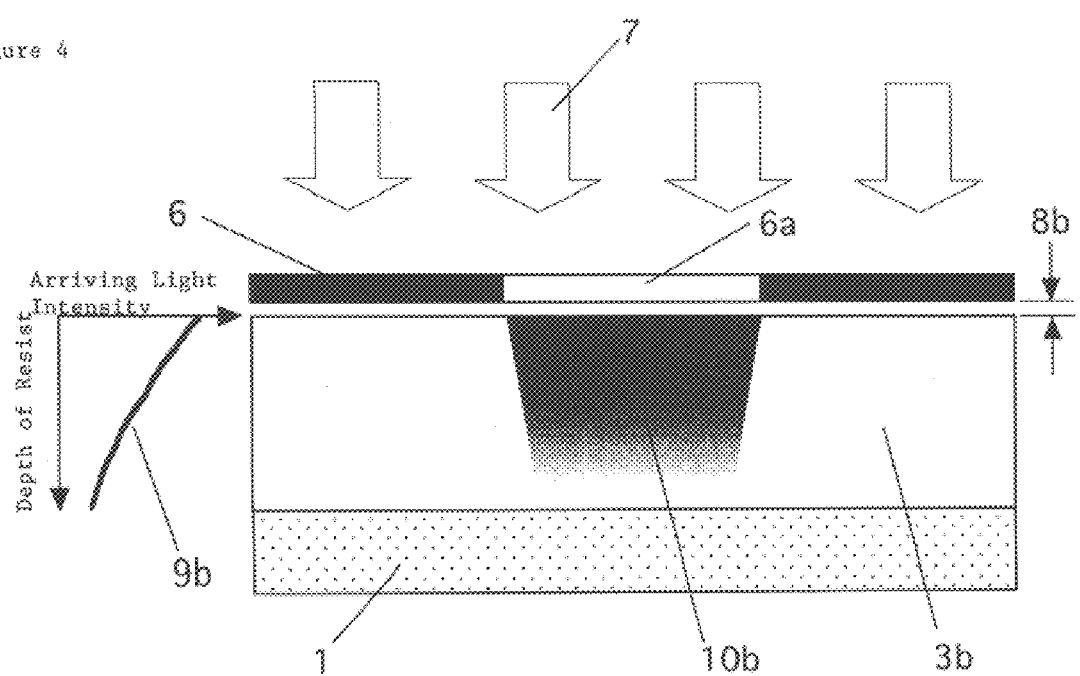
FIG. 4 is a schematic view illustrating the formation of a deposition-preventing layer having a reverse-tapered cross-section profile.

(2) Process for forming a deposition-preventing layer having a reverse-tapered cross-section profile:

FIG. 4 is a schematic view illustrating a method for the formation of a deposition-preventing layer having a reverse-tapered cross-section profile.

In FIG. 4, the reference numerals 6, 6a and 7 are the same as those in FIG. 3. In this, D indicates the gap distance between the mask 6 and a photo-polymerizing resin (negative resist) 10B to be a deposition-preventing layer. Also in FIG. 4, the graph on the left side is to schematically show the distribution of the light intensity arriving in the direction of the depth of the resist 10B. Where the transmission inhibiting substance content of the resist 10B is relatively small, the arriving light intensity decreases in the direction of the depth of the resist 10B, as indicated by the curve 9B in FIG. 4. In FIG. 4, 10b is to schematically indicate the condition of the light having arrived in the resist 10B. The dark area 10b has received intense light. The reason why the area 10b has a reversed trapezoidal shape, as in FIG. 4 illustrating the condition of the light having arrived in the resist 10B, is because the transmission inhibiting substance content of the resist 10B is large, and because the gap distance D is not large relative to the wavelength of the light applied to the resist 10B. In that condition, the radiated light is diffracted little around the edge area of the light-passing window 6a of the mask 6, and is therefore diffused little in the resist 10B. Preferably, the transmission inhibiting substance content of the resist 10B falls between 1 and 90% by weight of the total solid content of the photosensitive resin composition, more preferably between 5 and 50% by weight; and also preferably the gap distance D falls between 1λ and 100λ, more preferably between 10λ and 50λ, relative to the wavelength λ of the light applied to the resist 10B. In that condition, the cross section profile of the resist 10B in which the radiated light has arrived can have a reversed trapezoidal shape, as so indicated by 10b in FIG. 4. The reversed trapezoidal area of the resist 10B in which the radiated light has arrived is thus photo-cured, and then the non-exposed area of the resist 10B is removed through development. As a result, only the cured part of the resist 10B, of which the cross-section profile is like the shape of 10b in FIG. 4, remains on the substrate 1 to be thereon a deposition-preventing layer having a reverse-tapered cross-section profile.

A mask for patterning the photosensitive resin composition may be prepared by conventional methods known to those of ordinary skill in the are, such as by depositing a patterned layer of a material which prevents the transmission of light, (e.g. Cr metal) on to a transparent substrate (e.g.

glass). The thickness of the layer which prevents the transmission of light used to pattern the deposition preventing layer is typically from 20–300 nm, more preferably from 50–200 nm.

According to the combination of the processes (1) and (2) noted above, it is easy to form the deposition-preventing layer 3 that comprises the second deposition-preventing layer 3a and the first deposition-preventing layer 3b as in FIG. 1A to FIG. 1C. Precisely, according to the process (1), a film of the photosensitive resin composition that contains a transmission inhibiting substance is first formed on a substrate, and then this is pattern-wise exposed and developed into the second deposition-preventing layer 3a having a normal-tapered cross-section profile and having a predetermined thickness. Next, according to the process (2), a film of the photosensitive resin composition that contains a transmission inhibiting substance is formed over the second deposition-preventing layer 3a having been formed previously, and then this is pattern-wise exposed and developed into the first deposition-preventing layer 3b having a reverse-tapered cross-section profile and having a predetermined thickness.

FIG. 1A to FIG. 1C are to illustrate one embodiment of the organic EL device of the invention, in which the profile of the deposition-preventing layer illustrated is not limitative. The profile of the deposition-preventing layer to be in the organic EL device of the invention is not specifically defined. Depending on its object, the deposition-preventing layer to be in the organic EL device of the invention may have any desired profile.

The organic layer 4 overlying said electroconductive layer 2 and within the boundaries of the deposition-preventing layers 3a and 3b, serves as a hole transport layer, and this must be made of a material capable of efficiently receiving holes from the electroconductive layer 2 that serves as an anode and capable of efficiently transporting the thus-received holes. Accordingly, the material to form the organic layer 4 must satisfy the requirements of small ionization potential, large hole mobility and good stability, and, in addition, it is further necessary that the organic layer 4 made of the material does not give hole-trapping impurities while the device is fabricated or is driven.

The hole transport compound for the layer 4 includes, for example, aromatic diamine compounds (e.g., N,N'-diphenyl-N,N'-(3-methylphenyl)-1,1'-biphenyl-4,4'-diamine, 1,1'-bis(4-di-p-tolylaminophenyl)cyclohexane, 4,4'-bis(phenylamino)quadrophenyl, etc.) such as those described in Japanese Patent Laid-Open No. 194393/1984, U.S. Pat. Nos. 4,175,960, 4,923,774 and 5,047,687); hydrazone compounds such as those described in Japanese Patent Laid-Open No. 311591/1990; silazane compounds and quinacridone compounds such as those described in U.S. Pat. Nos. 4,950,950, etc. These compounds may be used either singly or as combined if necessary. Apart from the compounds noted above, also usable herein are polymer materials such as polyvinylcarbazoles, polysilanes and others (Appl. Phys. Lett., Vol. 59, p. 2760, 1991).

The hole transport layer of the hole transport material noted above is overlying said electroconductive layer and the deposition-preventing layers 3a and 3b through coating or vacuum vapor deposition. In the coating method, a coating solution is prepared from one or more of the organic hole transport compounds noted above optionally along with additives thereto, for example, a binder resin that does not trap holes, and a coatability improver such as a leveling agent or the like, and this is coated on the electroconductive 2, and dried to form an organic hole transport layer thereon.

In this method, polycarbonates, polyarylates, polyesters and the like may be used as the binder resin. However, using too much binder resin will lower the hole mobility in the layer formed. Therefore, it is desirable that the amount of the binder resin, if used, is small. For example, the binder content of the coating solution is preferably at most 50% by weight.

In the vacuum vapor deposition method, the organic hole transport material is put in a crucible disposed in a vacuum container, the vacuum container is degassed via a vacuum pump to have a vacuum degree of $10^{-6}$ Torr, then the crucible is heated so that the hole transport material therein is vaporized, and the vapor of the material is deposited on the electroconductive layer 2 and the deposition-preventing layers 3a and 3b overlying said substrate 1 which is so disposed as to face the crucible, thereby forming a hole transport layer thereon.

The thickness of the hole transport layer thus formed generally falls between 10 and 300 nm, but preferably between 30 and 100 nm. To uniformly form such a thin film of the hole transport layer, well used is the vacuum vapor deposition method.

An organic luminescent layer is overlying said hole transport layer, and this constitutes the organic layer 4 along with the underlying hole transport layer. The organic luminescent layer is between a pair of electrodes to which is applied an electric field, and it is necessary that the organic luminescent layer is made of a compound capable of efficiently receiving electrons from the electroconductive layer 5 that serves as a cathode and capable of efficiently transporting the thus-received electrons to the hole transport layer. Accordingly, the compound to form the organic luminescent layer must satisfy the requirements of high electron affinity, large electron mobility and good stability, and, in addition, it is further necessary that the organic luminescent layer made of the compound does not give electron-trapping impurities while the device is fabricated or is driven. What is more, the organic luminescent layer should have the function to emit light through hole and electron recombination. Still another requirement of the compound to form the organic luminescent layer is that it can be formed into a uniform and thin film for the layer, for ensuring the stability of the device.

The material of the organic luminescent layer includes, for example, aromatic compounds such as tetraphenylbutadiene, etc. (Japanese Patent Laid-Open No. 51781/1982); metal complexes such as aluminum complexes with 8-hydroxyquinoline, etc. (Japanese Patent Laid-Open No. 194393/1984, U.S. Pat. Nos. 5,151,629, 5,141, 671); cyclopentadiene derivatives (Japanese Patent Laid-Open No. 289675/1990); perylene derivatives (Japanese Patent Laid-Open No. 289676/1990); oxadiazole derivatives (Japanese Patent Laid-Open No. 216791/1990); bisstyrylbenzene derivatives (Japanese Patent Laid-Open Nos. 245087/1989, 222484/1990); perylene derivatives (Japanese Patent Laid-Open Nos. 189890/1990, 791/1991), coumarine compounds (Japanese Patent Laid-Open Nos. 191694/1990, 792/1991); rear earth complexes (Japanese Patent Laid-Open No. 256584/1989); distyrylpyrazine derivatives (Japanese Patent Laid-Open No. 252793/1990); p-phenylene compounds (Japanese Patent Laid-Open No. 33183/1991); thiadiazolopyridine derivatives (Japanese Patent Laid-Open No. 37293/1991); pyrrolopyridine derivatives (Japanese Patent Laid-Open No. 37293/1991); naphthyridinie derivatives (Japanese Patent Laid-Open No. 203982/1991), etc. Especially preferred are metal complexes to be formed from 8-hydroxyquinoline and its derivatives. The center atom to be in the metal complexes is preferably selected from Al, Ga, In, Sc, Y, Zn, Be, Mg and Ca. These metal complexes may be used either singly or as combined if necessary.

To form the organic luminescent layer from the material noted above, employable are the same methods as those for the organic hole transport layer noted above. Preferably, however, the organic luminescent layer is formed through vacuum vapor deposition, and its thickness may fall generally between 10 and 200 nm, preferably between 30 and 100 nm.

For the organic luminescent layer, a host material of a 8-hydroxyquinoline-aluminum complex may be doped with a fluorescent dye such as a coumarine dopant or the like for laser application, with which the color of the light to be emitted by the layer can be changed (J. Appi. Phys., Vol. 65, p. 3610, 1989). Also in the invention, the organic fluorescent layer may be doped with an organic fluorescent substance such as a laser dye or the like, for further improving the luminescent characteristics of the device, for which the dose may fall between $10^{-3}$ and 10 mol %. Where the organic luminescent layer is doped with such a fluorescent dye, the temperature of the substrate to be processed may fall between 80° C. and 150° C., at which the stability of the device fabricated is well ensured.

The organic EL device of the second aspect of the invention is described herein under.

The organic EL device of the second aspect of the invention comprises a substrate, a first electrode layer overlying said substrate, a deposition-preventing layer partly overlying said first electrode layer and forming at least a portion of boundaries of an active area of the electroluminescent device, and an organic luminescent layer and a second electrode layer formed in that order overlying the first electrode layer within the active area, characterized in that the resistivity of the deposition-preventing layer falls between $1 \times 10^{12}$ and $1 \times 10^4$ Ω·cm.

In the description of EL devices used throughout the specification, separate structures of a first electrode layer, a first deposition layer, an organic luminescent layer, and a second electrode layer are described. Within the context of the present invention, it will be appreciated that individual structures may be comprised of one or more layers, the combination of which making up an individual structure and/or layer.

In the organic EL device of the second aspect of the invention, the deposition-preventing layer fo rms an electrically semiconductive region having a resistivity of between $1 \times 10^{12}$ and $1 \times 10^4$ Ω·cm. With that constitution, therefore, the electrically insulating region on the surface of the substrate of the device can be reduced to a great extent. Accordingly, in the process of fabricating it, the device is free from the problem of such that the electrically insulating region is charged up in the pre-treatment step before film deposition or in the step of metallic film deposition. In addition, since the resistivity of the electrically semiconductive deposition-preventing layer is much higher than that of the luminescent region in the device, the adjacent luminescent cells in the device can be surely spaced or isolated from each other by the deposition-preventing layer.

The semiconductive deposition-preventing layer may be formed in different methods such as those described below.

In one method, a photosensitive resin is mixed with an electroconductive substance (e.g., carbon black, or metal powder of aluminum, nickel, etc.) to prepare a resin composition, and the resin composition is spin-coated on a substrate and dried thereon. The thus-coated substrate is exposed to light to have a desired pattern thereon through photolithography, and the unnecessary part is removed through development. As a result, a patterned, semiconductive deposition-preventing layer is overlying said substrate.

In another method, used is a linear, conjugated, electroconductive polymer, such as polyacetylene, polydiacetylene, polypyrrole, polyparaphenylene or the like, as the electroconductive substance for forming the deposition-preventing layer. The polymer material is characterized in that its electroconductivity can be varied to a desired degree by adding thereto a donor or acceptor substance. The electroconductive polymer is mixed with a photosensitive resin, and the resulting resin composition may be formed into the intended, semiconductive deposition-preventing layer through photolithography, as in the method mentioned previously.

In still another method, a semiconductive substance is directly layered on a substrate, and the layer overlying said substrate is patterned by etching away the unnecessary part of the layer. The semiconductive substance usable in this method includes, for example, Group IV elements such as silicon, gernanium, etc.; Group III-V compounds such as GaAs, InP, etc.; Group II-VI compounds such as ZnS, ZnTe, CaS, etc.; and also the above-mentioned electroconductive polymers. The semiconductive substance is coated on a substrate through vacuum vapor deposition or spin coating, thereby forming its layer on the substrate. Next, the layer is directly patterned through laser etching or the like, whereby is formed a semiconductive deposition-preventing layer having a desired pattern on the substrate. For patterning the layer of the semiconductive substance overlying said substrate, employable is another process comprising spin-coating a photoresist over the layer, pattern-wise developing the resist into a resist mask, then etching away the area of the semiconductive layer not masked with the resist mask by the use of an acidic etchant solution or the like, and finally removing the resist to obtain a semiconductive deposition-preventing layer having a desired pattern.

Of those methods, preferred is the method of using the photosensitive resin composition for forming the deposition-preventing layer through photolithography, since the layer of the composition is well patternable to give a patterned layer having good semiconductive properties with the underlying substrate being damaged little through the patterning operation and since the composition is easy to handle.

As the photosensitive resin composition for use in the method to form the deposition-preventing layer, especially preferred is a photosensitive resin composition derived from the photosensitive resin composition that is used for forming the deposition-preventing layer in the device of the first aspect of the invention noted above, by substituting a part or all of the transmission inhibiting substance therein with an electroconductive substance; or a photosensitive resin composition further containing an electroconductive substance in addition to the transmission inhibiting substance. Regarding the transmission inhibiting substance and other components except the electroconductive substance to be in the photosensitive resin composition for use in the second aspect, the blend ratio of the components constituting the composition, the method for forming the deposition-preventing layer from the composition, and the profile of the deposition-preventing layer formed, the same as those employed in producing the organic EL device of the first aspect mentioned above can apply to the device of the second aspect.

The electroconductive substance to be used in the second aspect is a substance having a specific resistivity of at most $1\times10^{10}$ Ω·cm, preferably at most $1\times10^3$ Ω·cm. In general, this is selected from dyes, pigments and metal powders, such as white pigments, fluorescent pigments and other pigments.

In consideration of the film-forming ability of the photosensitive resin composition and of the uniform dispersibility of the electroconductive substance in the deposition-preventing layer of the composition, it is desirable that the electroconductive substance is in the form of fine particles of which the primary particles have a mean particle size of from 0.005 to 0.5 μm or so, more preferably from 0.01 to 0.3 μm or so.

Especially preferred is carbon black. Generally used herein is carbon black having a specific surface area of from 25 to 500 g/m². Concretely, carbon black of that type includes Mitsubishi Carbon Black M1000 and Mitsubishi Carbon Black #40 (both from Mitsubishi Chemical), etc.

In the second aspect of the invention, used is a photosensitive resin composition containing an electroconductive substance but not a transmission inhibiting substance, or a photosensitive resin composition containing both an electroconductive substance and a transmission inhibiting substance to form the deposition-preventing layer. Like in the first aspect of the invention mentioned above, the photosensitive resin composition can be easily formed into the intended deposition-preventing layer having a desired cross-section profile also in the second aspect.

Carbon black is an electroconductive substance and is also a transmission inhibiting substance. Therefore, where carbon black is used in the photosensitive resin composition to form the deposition-preventing layer in the second aspect, it is unnecessary to further add any other transmission inhibiting substance to the composition.

However, if the amount of the electroconductive substance in the composition is too large, the resistivity of the deposition-preventing layer formed from the composition will lower. If so, the electric insulation between the adjacent luminescent cells in the device will be poor. On the contrary, however, if the amount of the electroconductive substance in the composition is too small, the profile control in forming the deposition-preventing layer will be difficult. Therefore, if desired, an additional transmission inhibiting substance may be added to the composition, depending on the balance between the resistivity of the deposition-preventing layer to be formed from the composition and the profile control in forming the layer.

As the additional transmission inhibiting substance, usable is any one exemplified hereinabove for the transmission inhibiting substance usable in fabricating the organic EL device of the first aspect as above. For example, the additional transmission inhibiting substance usable in the second aspect includes dyes, pigments and metal powders, such as white pigments, fluorescent dyes and other pigments.

The photosensitive resin composition to be used for forming the deposition-preventing layer in the second aspect comprises, a photo-polymerizing composition comprising 100 parts by weight of an organic polymer substance, from 0.01 to 30 parts by weight of a photo-polymerization initiator and from 5 to 100 parts by weight of an ethylenic compound, and an electroconductive substance and optionally a transmission inhibiting substance, in which the electroconductive substance accounts for from 0.01 to 90% by weight of the total solid content of the photosensitive resin composition. Using the photosensitive resin composition of that type to form the deposition-preventing layer in the electrically semiconductive region in the organic EL device solves the problem of charging up the region of the layer.

In the second aspect of the invention, the deposition-preventing layer formed is an electrically semiconductive layer having a resistivity of between $1\times10^{12}$ and $1\times10^4$ Ω·cm. If its resistivity is higher than $1\times10^{12}$ Ω·cm, the deposition-preventing layer will be an insulator, and therefore could not be free from the problem of charging it up. On the contrary, if its resistivity is lower than $1\times10^4$ Ω·cm, the layer will be a conductor, and therefore could not attain the intended cell separation. Preferably, the resistivity of the deposition-preventing layer falls between $1\times10^{11}$ and $1\times10^7$ Ω·cm.

Like the organic EL device of the first aspect mentioned above, the organic EL device of the second aspect of the invention may have a laminate structure as in FIGS. 1A to 1C.

Where the deposition-preventing layer is composed of a second deposition-preventing layer 3a and a first deposition-preventing layer 3b, as in FIGS. 1A to 1C, it is not always necessary to add an electroconductive substance to both the layers 3a and 3b, but the substance may be added to only either one of the layers while the other layer may contain a transmission inhibiting substance except electroconductive substances.

In the organic EL device of the second aspect of the invention, at least one of the deposition-preventing layers 3a and 3b is a semiconductor (that is, not an insulator). Therefore, in the process of producing the device comprising, for example, first forming the electroconductive layer 2 on the substrate 1, then forming the deposition-preventing layers 3a and 3b thereon, and thereafter subjecting the thus-layered substrate 1 to plasma processing in a mixed gas of argon and oxygen prior to the step of forming an organic layer thereon, the layered substrate is not charged up in the course of the pre-treatment step of plasma processing. Accordingly, one advantage of the organic EL device of the second aspect is that the device is free from the defects that may be caused by the charging up of the layers overlying said substrate.

The constitution illustrated in FIGS. 1A to 1C is one embodiment of the organic EL device of the first and second aspects of the invention. Without overstepping its scope and spirit, the invention is not limited to the illustrated embodiment.

For example, for the constitution of the layers to be overlying said substrate, except that of the deposition-preventing layer also to be formed thereon, employable are the following embodiments (1) to (5):

(1) Anode/organic hole transport layer/organic luminescent layer/cathode, (2) Anode/organic luminescent layer/electron transport layer/cathode, (3) Anode/organic hole transport layer/organic luminescent layer/electron transport layer/cathode, (4) Anode/organic hole transport layer/organic luminescent layer/interlayer/cathode, (5) Anode/organic hole transport layer/organic luminescent layer/electron transport layer/interlayer/cathode.

Within the context of the present invention, individual layers are described as overlying various regions/areas or layers. It will be understood by those of ordinary skill in the art that additional layers may be present in between the recited layers described as overlying various regions/areas or layers.

In the embodiments of layer constitution as above, the electron transport layer is for further improving the efficiency of the device, and this may be superposed over the organic luminescent layer. The compound to be used for forming the electron transport layer must satisfy the requirements of easy electron injection in the layer from the cathode and rapid electron transportation from the layer to the adjacent luminescent layer. The electron transport material suitable to the layer includes, for example, oxadiazole derivatives (Appl. Phys. Lett., Vol. 55, p. 1489, 1989; Jpn. J. Appl. Phys., Vol. 31, p. 1812, 1992); and their dispersions in resin such as PMMA (polymethyl methacrylate) or the like (Appl. Phys. Lett., Vol. 61, p. 2793, 1992). The thickness of the electron transport layer may fall generally between 5 and 200 nm, preferably between 10 and 100 nm.

In the embodiments of the layer constitution as above, the interlayer is to improve the contact between the cathode and the organic layer. The material to form the interlayer includes, for example, aromatic diamine compounds (Japanese Patent Laid-Open No. 267658/1994), quinacridone compounds (Japanese Patent Laid-Open No. 330031/1994), naphthalene derivatives (Japanese Patent Laid-Open No. 330032/1994), organosilicon compounds (Japanese Patent Laid-Open No. 325871/1994), organophosphortis compounds (Japanese Patent Laid-Open No. 325872/1994), etc. The thickness of the interlayer may fall generally between 2 and 100 nm, preferably between 5 and 30 nm.

In place of the interlayer of that type, a region containing at least 50 mol % of the interlayer material as above may be provided around the interface between the cathode and the organic luminescent layer or the electron transport layer in the device of the invention.

In the organic EL device comprising such a plurality of layers having different functions, all the layers except the deposition-preventing layer between the anode and the cathode shall be considered all together as the organic layer 4, as in FIGS. 1A and 1B.

Though not shown in FIGS. 1A to 1C, another substrate like the substrate 1 may be disposed above the electroconductive layer 5 that serves as a cathode. In this embodiment, at least one of the two substrates must have high transparency.

The organic EL device of the invention may have other different structures. For example, being different from those in FIGS. 1A to 1C, the layers may be placed in reverse order, or that is, the electroconductive layer (cathode), the organic luminescent layer, the hole transport layer and the electroconductive layer (anode) may be overlying said substrate in that order. Similarly, the order of the layers constituting the organic EL device of the embodiments (2) to (5) mentioned above may also be reversed. If desired, the layers of the device of those embodiments (2) to (5) may be sandwiched between two substrates, and at least one of the two substrates shall have high transparency.

The invention is described in more detail with reference to Examples and Comparative Examples mentioned below.

The following Examples are to demonstrate the organic EL device of the first aspect of the invention.

EXAMPLE 1

Formation of Deposition-preventing Layer with Normal-tapered Cross-section Profile:

A photo-polymerizing resin composition comprising the ingredients mentioned below was used as the essential component. To the essential component, added was a dispersion of a transmission inhibiting substance, red pigment (Chrome phthal Red having a resistivity $>1\times10^{12}$ $\Omega \cdot$cm having a mean particle size of 150 nm in propyleneglycol methylether acetate (PGMAc), to prepare a resist having a pigment content of 2% by weight of the total solid content of the composition.

Photo-polymerizing Resin Composition:

Photo-polymerization initiator, (5 wt.pts)

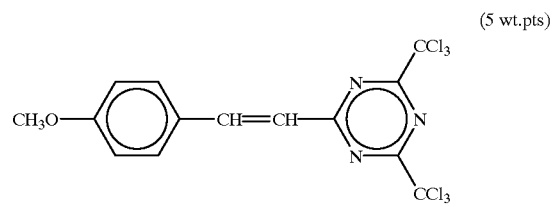

Organic polymer substance,

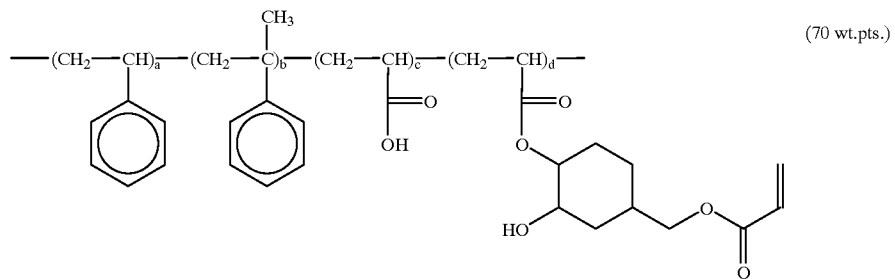

(70 wt.pts.)

(a:b:c:d = 45:15:20:20 (by mol); Mw of 12000)

(30 wt.pts.)

Ethylenic compound, dipentaerythritol hexaacrylate

The resist was spin-coated on a 1.1 mm-thick glass substrate of Corning's 1737 at 1200 rpm for 30 seconds, left dried for 1 minute, and then pre-baked on a hot plate at 70° C. for 2 minutes. Next, this was exposed to light (main wavelength: 365 nm) to a total of 200 mJ/cm$^2$, via a patterning mask (Patterned Cr, deposited at a thickness 100 nm, on a glass substrate 3 mm thick). The gap distance between the glass mask and the resist film was 30 µm. Next, this was processed with a spray of a developer uniformly running thereto through a plurality of nozzles under a pressure of 0.1 MPa, for 30 seconds, whereby the non-exposed area of the resist was developed. The developer used herein was prepared by adding 0.3% by weight of a surfactant, Kao's A60, to an aqueous 0.3 wt. % solution containing potassium carbonate (K$_2$CO$_3$) and potassium hydrogencarbonate (KHCO$_3$) in a ratio of 1/0.1 by mol. Next, the thus-developed substrate was washed with pure water under a pressure of 0.2 MPa for 60 seconds. The thus-washed substrate was then post-baked on a hot plate at 120° C. for 1 minute, whereby was formed a deposition-preventing layer on the substrate.

Figure 5:
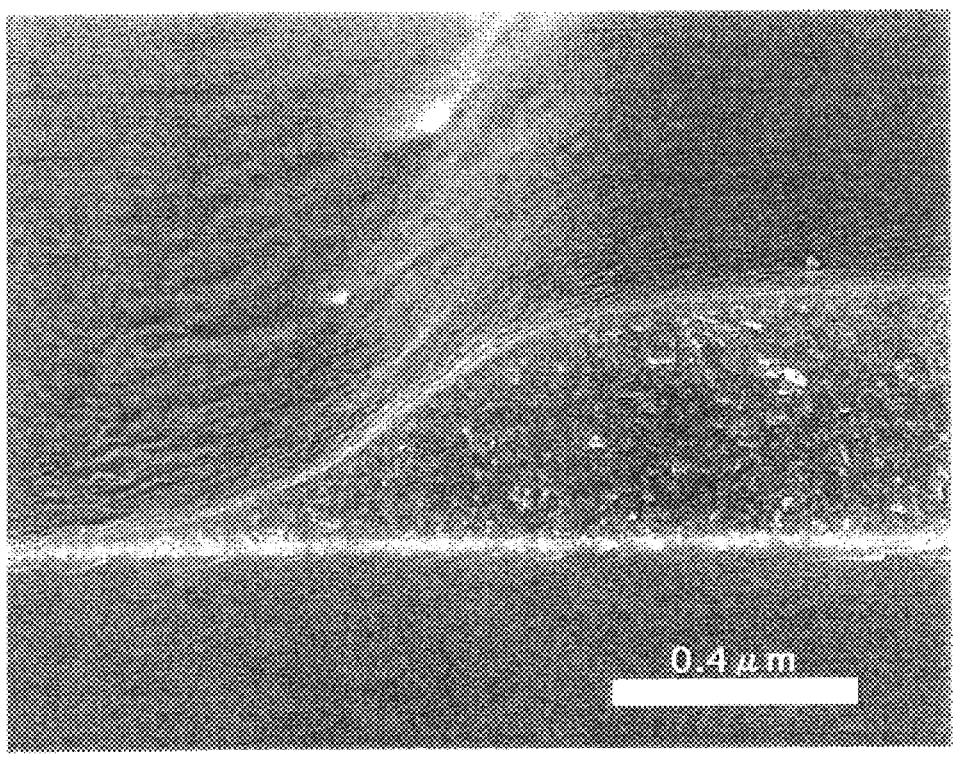
FIG. 5 is a SEM picture of the edge area of the normal-tapered deposition-preventing layer formed in Example 1.

A SEM picture of the edge area of the deposition-preventing layer overlying said substrate is in FIG. 5. The resistivity of the deposition-preventing layer was >1×10$^{12}$ Ω·cm. The deposition-preventing layer had a normal-tapered cross-section profile, and the tapered angle of the layer to the substrate was about 145° on average.

The mean value of the tapered angle of the deposition-preventing layer to the substrate could be measured, for example, as follows: A specimen having a flat cross section of the layer is prepared from the sample produced herein, and its picture is taken through SEM. Using a scanner, the picture is inputted into a computer, in which the picture is two-dimensionally differentiated to give a differential image. On the uppermost surface in the image, the boundary is extracted out. In the edge area in the thus-extracted boundary, the angle of the layer to the substrate is read. The thus-read angle is corrected from the degree of inclination of the pedestal of the SEM device used, and the intended tapered angle is thus obtained.

EXAMPLE 2
Formation of Deposition-preventing Layer with Reverse-tapered Cross-section Profile:

The same photo-polymerizing resin composition as in Example 1 was used as the essential component. To the essential component, added was a dispersion of a transmission inhibiting substance, blue pigment (Phthalocyanine blue (resistivity >1×10$^{12}$ Ω·cm) having a mean particle size of 150 nm in PGMAc, to prepare a resist having a pigment content of 25% by weight of the total solid content of the composition.

The resist was spin-coated on a glass substrate of Corning's 1737 at 1200 rpm for 30 seconds, left dried for 1 minute, and then pre-baked on a hot plate at 70° C. for 2 minutes. Next, this was exposed to light (main wavelength: 365 nm) to a total of 800 mJ/cm$^2$, via a patterning mask (Patterned Cr, deposited at a thickness 100 nm, on a glass substrate 3 mm thick). The gap distance between the glass mask and the resist film was 10 μm. Next, this was developed, washed and post-baked in the same manner as in Example 1, whereby was formed a deposition-preventing layer on the substrate.

Figure 6:
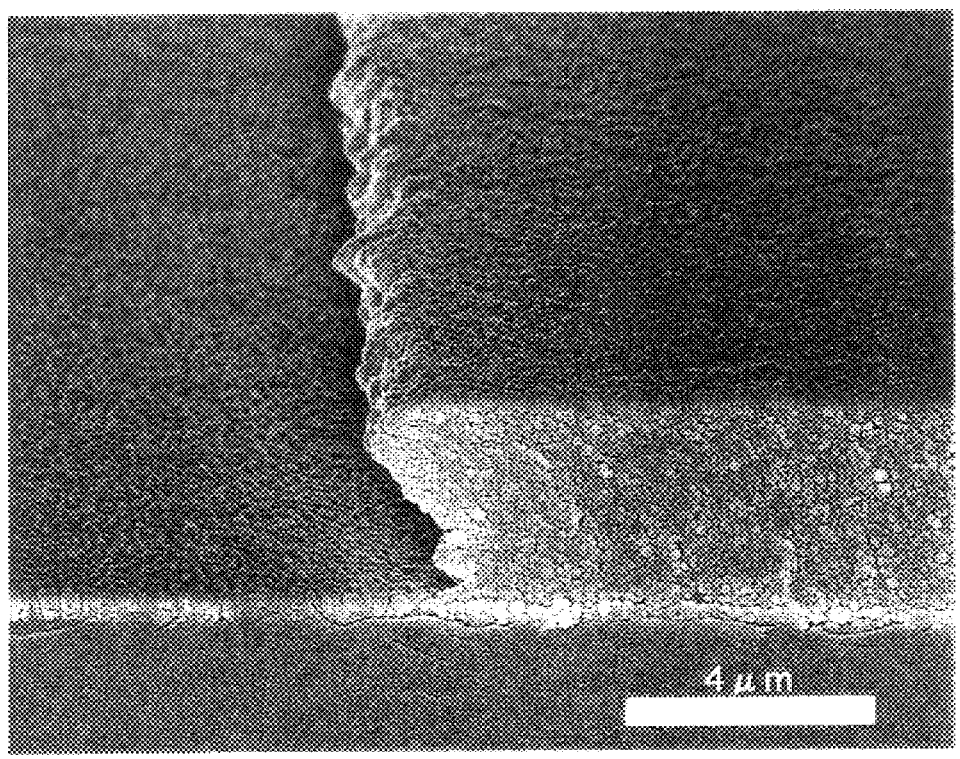
FIG. 6 is a SEM picture of the edge area of the reverse-tapered deposition-preventing layer formed in Example 2.

A SEM picture of the edge area of the deposition-preventing layer overlying said substrate is in FIG. 6. The resistivity of the deposition preventing layer was >1×10$^{12}$ Ω·cm. The deposition-preventing layer had a reverse-tapered cross-section profile, and the tapered angle of the layer to the substrate was about 50° on average.

EXAMPLE 3

A glass substrate 1 was made of a 1.1 mm-thick glass sheet of Corning's 1737. On this, deposited was an anode 2, a transparent electroconductive film of indium tin oxide (ITO) having a thickness of 120 nm (Geomatic's electronic beam-deposited film, having a sheet resistance of 20 Ω). Thus was prepared an ITO film-coated glass substrate.

On the substrate, fabricated was an organic EL device having the structure of FIGS. 1A to 1C, in the manner mentioned below.

First, the transparent electroconductive film of ITO deposited on the glass substrate 1 was stripe-wise patterned through ordinary photolithography using an HCl etchant. The electroconductive anode layer 2 thus processed had a stripe-like pattern with a line width of 270 μm at a pitch of 300 μm.

Next, a deposition-preventing layer 3a having a reverse-tapered cross-section profile was formed in the same manner as in Example 1. The layer 3a had a lattice-like structure with apertures of 250 μm×250 μm being disposed in plane at a pitch of 300 μm. To form the layer 3a, the viscosity of the resist used was so controlled that the thickness of the layer 3a could be about 0.5 μm. The tapered angle (mean value) of the layer 3a to the substrate was about 146°. The resistivity of the layer 3a was >1×10$^{12}$ Ω·cm.

Next, a deposition-preventing layer 3b having a reverse-tapered cross-section profile was overlying said layer 3a, in the same manner as in Example 2. The layer 3b had a stripe-like pattern with a line width of 30 μm at a pitch of 300 μm. This crossed the electroconductive anode layer 2 at right angles, and was on the layer 3a. To form the layer 3b, the viscosity of the resist used was so controlled that the thickness of the layer 3b could be about 4 μm. The tapered angle (mean value) of the layer 3b to the substrate was about 52°. The resistivity of the layer 3b was >1×10$^{12}$ Ω·cm.

The substrate 1 thus having two deposition-preventing layers 3a and 3b thereon was washed in pure water, dried with a blow of nitrogen, and then washed with UV/ozone for 10 minutes. Next, this was put in a vacuum vapor deposition chamber, and degassed via a cryopump to a vacuum degree of 1.1×10$^{-6}$ Torr (about 1.5×10$^{-4}$ Pa).

Next, copper phthalocyanine (having a crystal morphology of β-type; its chemical stricture is shown below) put in a molybdenum boat in the vacuum vapor deposition chamber was heated, vaporized, and deposited on the substrate. During the deposition operation, the vacuum degree in the chamber was kept at 1.1×10$^{-6}$ Torr (about 1.5×10$^{-4}$ Pa), and the deposition time was 1 minute. Thus was formed a hole injection layer having a thickness of 20 nm.

Copper phthalocyanine:

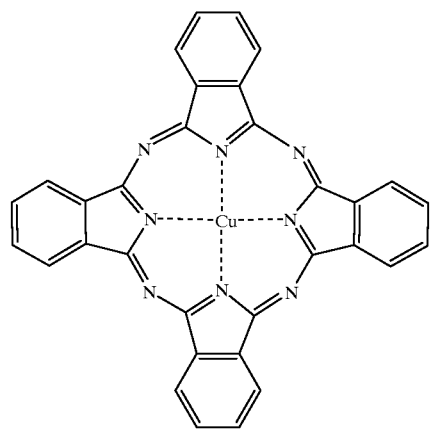

Next, 4,4'-bis[N-(1-naphthyl)-N-phenylamino]biphenyl (its chemical structure is shown below) put in a ceramic crucible in the chamber was heated with a tantalum wire heat disposed around the crucible, vaporized and deposited on the substrate. Thus was formed a hole transport layer on the hole injection layer. In this step, the temperature of the crucible was controlled to fall between 230 and 240° C., the vacuum degree in the chamber was 8×10$^{-7}$ Torr (about 1.1×10$^{-4}$ Pa), and the deposition time was 1 minute and 50 seconds. The hole transport layer formed had a thickness of 60 nm. 4,4'-Bis[N-(1-naphthyl)-N-phenylamino]biphenyl:

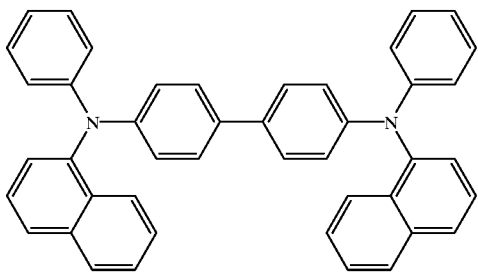

As the material for the organic luminescent layer having a function of light emission, herein used was aluminum 8-hydroxyquinoline complex (Al(C$_9$H$_6$NO)$_3$), its chemical structure is shown below). The complex was deposited on the hole transport layer in the same manner as previously. In this step, the temperature of the crucible containing the complex therein was controlled to fall between 310 and 320° C., the vacuum degree in the chamber was 9×10$^{-7}$ Torr (about 1.2×10$^{-4}$ Pa), and the deposition time was 2 minutes and 40 seconds. The organic luminescent layer formed had a thickness of 75 nm.

Aluminum 8-hydroxyquinoline complex:

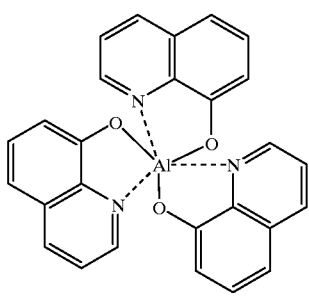

The substrate on which the hole injection layer, the hole transport layer and the organic luminescent layer were being formed through vacuum vapor deposition was kept at room temperature.

Next, in the vacuum chamber, an electroconductive cathode layer 5 of an alloy of magnesium and silver was deposited on the substrate through co-deposition of the two elements, Mg and Ag. The thickness of the layer 5 thus formed was 100 nm. For the deposition, used were two molybdenum boats for the respective elements. The vacuum degree during deposition was 1×10$^{-5}$ Torr (about 1.3×10$^{-3}$ Pa), and the deposition time was 3 minutes and 10 seconds. The atomic ratio of magnesium to silver was 10/1.1. Next, in the same vacuum chamber, aluminum (this was put in a molybdenum boat) was further deposited on the 100 nm-thick magnesium-silver alloy film to complete the electroconductive cathode layer 5. During the aluminum deposition, the vacuum degree was 2.3×10$^{-5}$ Torr (about 3.1×10$^{-3}$ Pa), and the deposition time was 1 minute and 40 seconds. The substrate on which the two-layered cathode composed of magnesium-silver alloy and aluminum was being formed through vacuum vapor deposition was kept at room temperature.

Next, the substrate thus having the layered structure including the cathode formed thereon was transferred into a dry box filled with nitrogen gas, and was sealed. Precisely, an epoxy-type photo-polymerizing resin (having a viscosity of 45 Pa·s and curable through exposure to 4000 mJ/cm$^2$) was first applied to the periphery (width:1 mm) of the substrate in such a manner that the anode and cathode lead-out area could be outside the seal. Next, a sealant member of sheet glass having a thickness of 0.7 mm was fitted to the sealed area of the substrate, and the photo-polymerizing resin was exposed to light from a high-pressure mercury lamp (output: 200 W) via the sealant member, whereby the resin was cured completely. Next, this was taken out of the dry box. The organic EL device thus fabricated had a plurality of cells aligned and spaced or isolated from each other in the intended manner, in which each cell had a size of 300 μm×300 μm.

The device was electrically connected with a driving circuit in such a manner that the electroconductive anode layer 2 could be charged plus while the electroconductive cathode layer 5 could be minus, and tested for its light emission. In the test, the device gave a uniform light pattern with no line defects.

Next, the device was subjected to a life test in which the device driven gave an initial luminance of 200 cd/m$^2$ from its entire surface. After driven for 500 hours in the test, the device still gave a luminance of 82% of the initial luminance, and had no pattern defects.

Nine devices were fabricated in the same manner as above, and they were subjected to the lighting test for its initial light emission and to the life test running for 500 hours. After the life test, the devices having been driven for 500 hours all had a luminance retentiveness of 81% on average, and had no pattern defects at all.

The following Examples are to demonstrate the organic EL device of the first and second aspects of the invention.

EXAMPLE 4

Formation of Deposition-preventing Layer with Normal-tapered Cross-section Profile:

A photo-polymerizing resin composition comprising the ingredients mentioned below was used as the essential component. To the essential component, added was an electroconductive transmission inhibiting substance, carbon black (Mitsubishi Carbon Black MA200) having a mean particle size of 130 nm, to prepare a resist having a carbon black content of 10% by weight of the total solid content of the composition.

Photo-polymerizing Resin Composition:

Photo-polymerization initiator, (5 wt.pts)

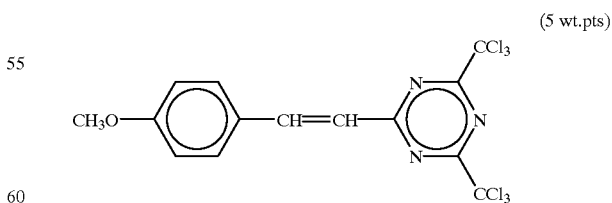

Organic polymer substance,

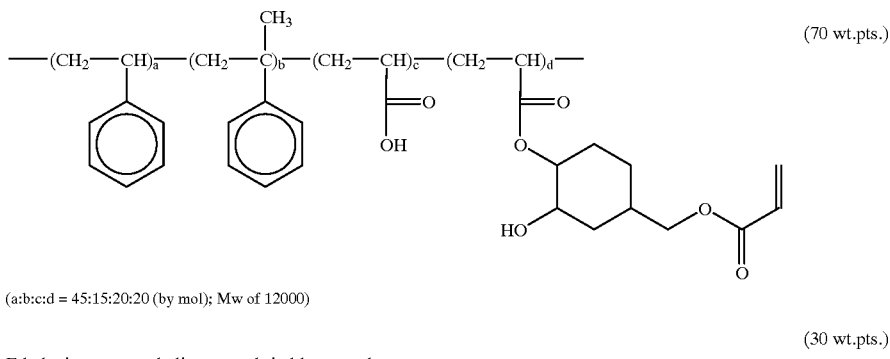

(70 wt.pts.)

(a:b:c:d = 45:15:20:20 (by mol); Mw of 12000)

Ethylenic compound, dipentaerythritol hexaacrylate (30 wt.pts.)

The resist was spin-coated on a 1.1 mm-thick glass substrate of Corning's 1737 at 1200 rpm for 30 seconds, left dried for 1 minute, and then pre-baked on a hot plate at 70° C. for 2 minutes. Next, this was exposed to light (main wavelength: 365 nm) to a total of 200 mJ/cm$^2$, via a patterning mask (Patterned Cr, deposited at a thickness 100 nm, on a glass substrate 3 mm thick). The gap distance between the glass mask and the resist film was 30 μm. Next, this was processed with a spray of a developer uniformly running thereto through a plurality of nozzles under a pressure of 0.1 MPa, for 30 seconds, whereby the non-exposed area of the resist was developed. The developer used herein was prepared by adding 0.3% by weight of a surfactant, Kao's A60, to an aqueous 0.3 wt. % solution containing potassium carbonate K$_2$CO$_3$) and potassium hydrogencarbonate (KHCO$_3$) in a ratio of 1/0.1 by mol. Next, the thus-developed substrate was washed with pure water under a pressure of 0.2 MPa for 60 seconds. The thus-washed substrate was then post-baked on a hot plate at 120° C. for 1 minute, whereby was formed a deposition-preventing layer on the substrate.

Figure 7:
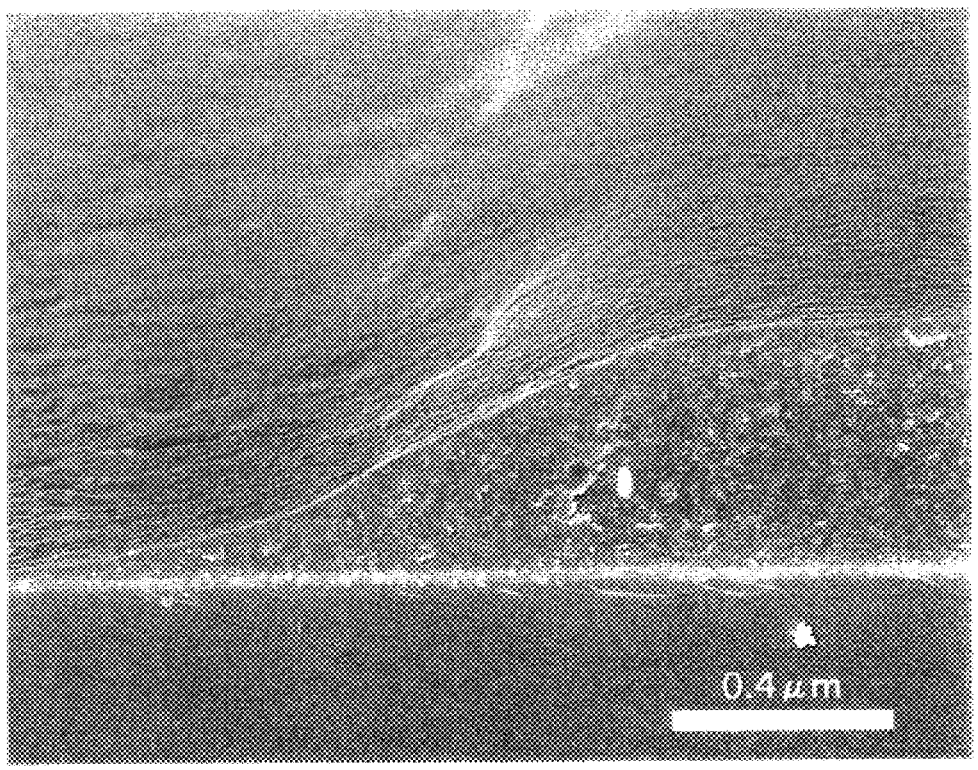
FIG. 7 is a SEM picture of the edge area of the normal-tapered deposition-preventing layer formed in Example 4.

A SEM picture of the edge area of the deposition-preventing layer overlying said substrate is in FIG. 7. The deposition-preventing layer had a normal-tapered cross-section profile, and the tapered angle of the layer to the substrate was about 140° on average. The layer had a resistivity of 2.5×10$^9$ Ω·cm.

The mean value of the tapered angle of the deposition-preventing layer to the substrate could be measured, for example, as follows: A specimen having a flat cross section of the layer is prepared from the sample produced herein, and its picture is taken through SEM. Using a scanner, the picture is inputted into a computer, in which the picture is two-dimensionally differentiated to give a differential image. On the uppermost surface in the image, the boundary is extracted out. In the edge area in the thus-extracted boundary, the angle of the layer to the substrate is read. The thus-read angle is corrected from the degree of inclination of the pedestal of the SEM device used, and the intended tapered angle is thus obtained.

The resistivity of the deposition-preventing layer could be measured as follows: First formed is a reference lower electrode of an electroconductive substance such as Cr or the like on a substrate. Next, the deposition-preventing layer to be measured is formed thereon according to the method mentioned above. Further formed thereon is another reference upper electrode of Au in a limited square region of 1 cm×1 cm. In that condition, the resistance between the upper electrode and the lower electrode is measured. On the other hand, the thickness of the deposition-preventing layer formed herein is measured. From the resistance between the two electrodes and the thickness of the deposition-preventing layer thus measured, and from the area of the Lipper electrode (in this case, the area is 1 cm$^2$), calculated is the resistivity of the deposition-preventing layer.

EXAMPLE 5

Formation of Deposition-preventing Layer with Reverse-tapered Cross-section Profile:

The same photo-polymerizing resin composition as in Example 4 was used as the essential component. To the essential component, added was an electroconductive transmission inhibiting substance, carbon black (Mitsubishi Carbon Black MA200) having a mean particle size of 130 nm, along with a dispersion of a transmission inhibiting substance, blue pigment having a mean particle size of 150 nm in PGMAc, to prepare a resist having a carbon black content of 10% by weight of the total solid content of the composition and having a pigment content of 15% by weight of the same. In the resist, the sum of the transmission inhibiting substances was therefore 25% by weight of the total solid content of the composition.

The resist was spin-coated on a glass substrate of Corning's 1737 at 1200 rpm for 30 seconds, left dried for 1 minute, and then pre-baked on a hot plate at 70° C. for 2 minutes. Next, this was exposed to light (main wavelength: 365 nm) to a total of 800 mJ/cm$^2$, via a patterning mask (Patterned Cr, deposited at a thickness 100 nm, on a glass substrate 3 mm thick). The gap distance between the mask and the resist film was 10 μm. Next, this was developed, washed and post-baked in the same manner as in Example 4, whereby was formed a deposition-preventing layer on the substrate.

Figure 8:
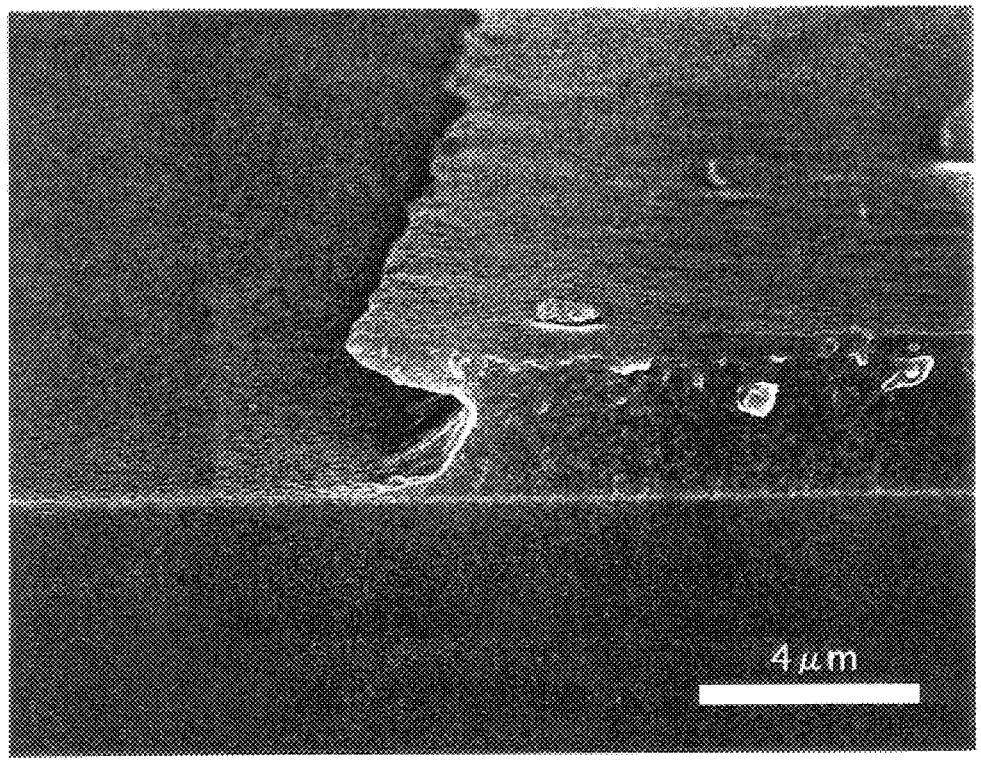
FIG. 8 is a SEM picture of the edge area of the reverse-tapered deposition-preventing layer formed in Example 5.

A SEM picture of the edge area of the deposition-preventing layer overlying said substrate is in FIG. 8. The deposition-preventing layer had a reverse-tapered cross-section profile, and the tapered angle of the layer to the substrate was about 50° on average. The layer had a resistivity of 2.6×10$^9$ Ω·cm.

EXAMPLE 6

A glass substrate 1 was made of a 1.1 mm-thick glass sheet of Corning's 1737. On this, deposited was an anode 2, a transparent electroconductive film of indium tin oxide (ITO) having a thickness of 120 nm (Geomatic's electronic beam-deposited film, having a sheet resistance of 20 Ω). Thus was prepared an ITO film-coated glass substrate.

On the substrate, fabricated was an organic EL device having the structure of FIGS. 1A to 1C, in the manner mentioned below.

First, the transparent electroconductive film of ITO deposited on the glass substrate 1 was stripe-wise patterned through ordinary photolithography using an HCl etchant. The electroconductive anode layer 2 thus processed had a stripe-like pattern with a line width of 270 μm at a pitch of 300 μm.

Next, a deposition-preventing layer 3a having a reverse-tapered cross-section profile was formed in the same manner as in Example 4. The layer 3a had a lattice-like structure with apertures of 250 μm×250 μm being disposed in plane at a pitch of 300 μm. To form the layer 3a, the viscosity of the resist used was so controlled that the thickness of the layer 3a could be about 0.5 μm. The tapered angle (mean value) of the layer 3a to the substrate was about 138°. The layer 3a had a resistivity of $2.5 \times 10^9$ Ω·cm.

Next, a deposition-preventing layer 3b having a reverse-tapered cross-section profile was overlying said layer 3a, in the same manner as in Example 5. The layer 3b had a stripe-like pattern with a line width of 30 μm at a pitch of 300 μm. This crossed the electroconductive anode layer 2 at right angles, and was on the layer 3a. To form the layer 3b, the viscosity of the resist used was so controlled that the thickness of the layer 3b could be about 4 μm. The tapered angle (mean value) of the layer 3b to the substrate was about 52°. The layer 3b had a resistivity of $2.9 \times 10^9$ Ω·cm.

The substrate 1 thus having two deposition-preventing layers 3a and 3b thereon was washed in pure water, dried with a blow of nitrogen, and then washed with UV/ozone for 10 minutes. Next, this was put in a vacuum chamber, and subjected to plasma processing with a 0.1 Torr mixed gas of argon and oxygen for 5 minutes. Without being exposed to air, this was directly transferred into a vacuum vapor deposition chamber, and degassed via a cryopump to a vacuum degree of $1.1 \times 10^{-6}$ Torr (about $1.5 \times 10^{-4}$ Pa).

Next, copper phthalocyanine (having a crystal morphology of β-type; its chemical structure is shown below) put in a molybdenum boat in the vacuum vapor deposition chamber was heated, vaporized, and deposited on the substrate. During the deposition operation, the vacuum degree in the chamber was kept at $1.1 \times 10^{-6}$ Torr (about $1.5 \times 10^{-4}$ Pa), and the deposition time was 1 minute. Thus was formed a hole injection layer having a thickness of 20 nm.

Copper Phthalocyanine:

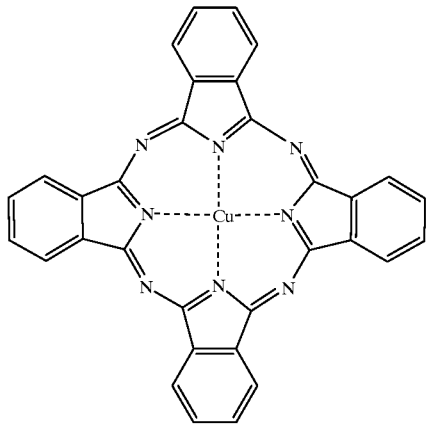

Next, 4,4'-bis[N-(1-naphthyl)-N-phenylamino]biphenyl (its chemical structure is shown below) put in a ceramic crucible in the chamber was heated with a tantalum wire heat disposed around the crucible, vaporized and deposited on the substrate. Thus was formed a hole transport layer on the hole injection layer. In this step, the temperature of the crucible was controlled to fall between 230 and 240° C., the vacuum degree in the chamber was $8 \times 10^{-7}$ Torr (about $1.1 \times 10^{-4}$ Pa), and the deposition time was 1 minute and 50 seconds. The hole transport layer formed had a thickness of 60 nm.

4,4'-Bis[N-(1-naphthyl)-N-phenylamino]biphenyl:

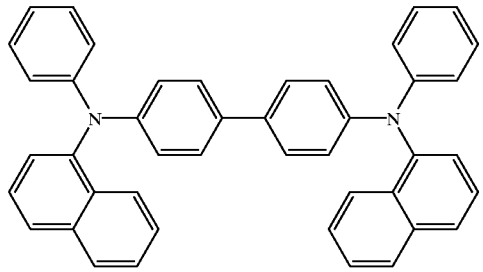

As the material for the organic luminescent layer having a function of light emission, herein used was aluminum 8-hydroxyquinoline complex ($Al(C_9H_6NO)_3$, its chemical structure is shown below). The complex was deposited on the hole transport layer in the same manner as previously. In this step, the temperature of the crucible containing the complex therein was controlled to fall between 310 and 320° C., the vacuum degree in the chamber was $9 \times 10^{-7}$ Torr (about $1.2 \times 10^{-4}$ Pa), and the deposition time was 2 minutes and 40 seconds. The organic luminescent layer formed had a thickness of 75 nm.

Aluminum 8-hydroxyquinoline complex:

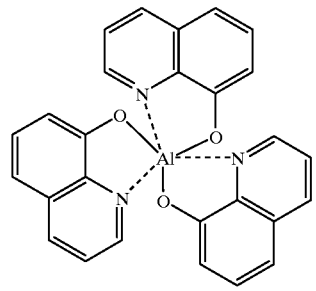

The substrate on which the hole injection layer, the hole transport layer and the organic luminescent layer were being formed through vacuum vapor deposition was kept at room temperature.

Next, in the vacuum chamber, an electroconductive cathode layer 5 of an alloy of magnesium and silver was deposited on the substrate through co-deposition of the two elements, Mg and Ag. The thickness of the layer 5 thus formed was 100 nm. For the deposition, used were two molybdenum boats for the respective elements. The vacuum degree during deposition was $1 \times 10^{-5}$ Torr (about $1.3 \times 10^{-3}$ Pa), and the deposition time was 3 minutes and 10 seconds. The atomic ratio of magnesium to silver was 10/1.1. Next, in the same vacuum chamber, aluminum (this was put in a molybdenum boat) was further deposited on the 100 nm-thick magnesium-silver alloy film to complete the electroconductive cathode layer 5. During the aluminum deposition, the vacuum degree was $2.3 \times 10^{-5}$ Torr (about $3.1 \times 10^{-3}$ Pa), and the deposition time was 1 minute and 40 seconds. The substrate on which the two-layered cathode composed of magnesium-silver alloy and aluminum was being formed through vacuum vapor deposition was kept at room temperature.

Next, the substrate thus having the layered structure including the cathode formed thereon was transferred into a dry box filled with nitrogen gas, and was sealed. Precisely, an epoxy-type photo-polymerizing resin (having a viscosity of 45 Pa·s and curable through exposure to 4,000 mJ/cm$^2$) was first applied to the periphery (width: 1 mm) of the substrate in such a manner that the anode and cathode lead-out area could be outside the seal. Next, a sealant member of sheet glass having a thickness of 0.7 mm was fitted to the sealed area of the substrate, and the photo-polymerizing resin was exposed to light from a high-pressure mercury lamp (output: 200 W) via the sealant member, whereby the resin was cured completely. Next, this was taken out of the dry box. The organic EL device thus fabricated had a plurality of cells aligned and spaced or isolated from each other in the intended manner, in which each cell had a size of 300 $\mu$m×300 $\mu$m.

The device was electrically connected with a driving circuit in such a manner that the electroconductive anode layer 2 could be charged plus while the electroconductive cathode layer 5 could be minus, and tested for its light emission. In the test, the device gave a uniform light pattern with no line defects.

Next, the device was subjected to a life test in which the device driven gave an initial luminance of 200 cd/m$^2$ from its entire surface. After driven for 500 hours in the test, the device still gave a luminance of 82% of the initial luminance, and had no pattern defects.

Nine devices were fabricated in the same manner as above, and they were subjected to the lighting test for its initial light emission and to the life test running for 500 hours. After the life test, the devices having been driven for 500 hours all had a luminance retentiveness of 81% on average, and had no pattern defects at all.

COMPARATIVE EXAMPLE 1

In the same manner as in Example 3, a transparent electroconductive film was deposited on a glass substrate and patterned to prepare an ITO-patterned substrate having a line width of 270$\mu$m at a pitch of 300 $\mu$m.

Next, using a commercially-available negative photoresist, V-259PA (from Shin-Nittetsu Chemical), in the absence of a transmission inhibiting substance, which has heretofore been generally used for organic EL devices, a deposition-preventing layer having a normal-tapered cross-section profile was overlying said substrate. For this, the exclusive developer designated by the maker, Shin-Nittetsu Chemical was used, and the photoresist-coated substrate was processed according to the exclusive process also designated by the maker. Next, using another commercially-available negative photoresist, ZPN1100 (from Nippon Zeon) in the absence of a transmission inhibiting substance, another deposition-preventing layer having a reverse-tapered cross-section profile was overlying said previously-formed layer. For this, the exclusive developer designated by the maker, Nippon Zeon was used, and the photoresist-coated substrate was processed according to the process also designated by the maker.

On the other hand, control samples were prepared under the same conditions as above. In those samples, the thickness of the deposition-preventing layer and the tapered angle of the layer to the substrate were measured. As a result, the thickness of the deposition-preventing layer of V-259PA was about 0.42 $\mu$m, and the tapered angle thereof to the substrate was about 122°; and the thickness of the deposition-preventing layer of ZPN1100 was about 4.5 $\mu$m, and the tapered angle thereof to the substrate was about 65°. The two deposition-preventing layers both had a resistivity of $1\times10^{13}$ $\Omega$·cm. The patterns of the two layers formed herein were the same as those of the deposition-preventing layers formed in Example 3.

Next, in the same manner as in Example 3, the substrate was subjected to plasma processing, and a hole injection layer, a hole transport layer, an organic luminescent layer and an electroconductive cathode layer were formed thereon. Also in the same manner, the substrate was sealed to fabricate an organic EL device.

The device was tested for light emission in the same manner as in Example 3, and it gave a uniform light pattern with no line defects.

Next, the device was subjected to a life test in which the device driven gave an initial luminance of 200 cd/m$^2$ from its entire surface. However, after having been driven for 100 hours, the device had many pattern defects; and after 150 hours, it could not emit light.

Nine devices were fabricated in the same manner as above, and they were subjected to the lighting test for its initial light emission and to the life test in the same manner as above. Two of nine devices tested had pattern defects in the initial stage; and after 100 hours, six devices had pattern defects. The mean driving time before the ten devices could no more emit light was 160 hours.

The test data of the devices of Example 3, Example 6 and Comparative Example 1 are shown in Table 1 below, from which it is understood that the organic EL devices of the invention are all highly efficient and stable and have high reliability.

TABLE 1

| | Initial Failure (%) | Failure after driven for 100 hours (%) | Mean Lifetime (half-luminance time) |
|---|---|---|---|
| Example 3 | 0 | 0 | more than 500 hours |
| Example 6 | 0 | 0 | more than 500 hours |
| Comparative Example 1 | 20 | 80 | 160 hours |

As described in detail hereinabove, the organic EL device of the first aspect of the invention has the advantage of greatly reduced radiative recombination probability in the non-selected area of the organic luminescent layer in the device. According to the method of the invention for producing the device through microfabrication, a deposition-preventing layer of a desired shape is formed with accuracy to facilitate and ensure micro-patterning in fabricating the device. The patterning failure in the device is greatly reduced, and the device has a prolonged life for good light emission.

In the organic EL device of the second aspect of the invention, the deposition-preventing layer is so controlled that it is not charged up so as not to cause abnormal discharging or abnormal sputtering in the subsequent steps of forming the other element layers thereon, thereby increasing the good yield of high-quality devices with few defects.

Accordingly, the organic EL device of the invention has many applications to, for example, flat panel displays (e.g., for OA computers and wall-hanging, televisions), signboards, and beacon lights, and its technical value is extremely great.

While the invention has been described in detail and with reference to specific embodiments thereof, it will be apparent to one skilled in the art that various changes and modifications can be made therein without departing from the spirit and scope thereof.

This application is based on Japanese patent applications 017311/1999, 017312/1999 and 124385/1999 filed in the Japanese Patent Office on Jan. 26, 1999, Jan. 26, 1999 and Apr. 30, 1999 respectively, the entire contents of each of which are hereby incorporated by reference.

What is claimed as new and desired to be secured by Letters Patent of the United States is:

1. An organic electroluminescent device which comprises a substrate, a first electrode layer overlying said substrate, a first deposition-preventing layer partly overlying said first electrode layer and forming at least a portion of boundaries of an active area of said electroluminescent device and an organic luminescent layer and a second electrode layer formed in that order overlying said first electrode layer within said active area, wherein, said first deposition-preventing layer is made by irradiation of a photosensitive resin composition comprising:
  i) a polymerizable compound; and
  ii) a photoinitiator having an initiation wavelength $\lambda$,
wherein said photosensitive resin composition has a reduced transmission of light of wavelength $\lambda$.

2. The organic electroluminescent device of claim 1, wherein said photosensitive resin composition comprises:
  i) a polymerizable compound;
  ii) a photoinitiator having an initiation wavelength $\lambda$; and
  iii) a substance which inhibits transmission of light of wavelength $\lambda$ and which does not promote photo-curing of said composition.

3. The organic electroluminescent device of claim 2, wherein said substance which inhibits transmission of light of wavelength $\lambda$ is an electroconductive substance.

4. The organic electroluminescent device of claim 2, wherein said first deposition-preventing layer has a resistivity falling between $1\times10^{12}$ and $1\times10^4$ $\Omega\cdot$cm.

5. The organic electroluminescent device of claim 1, wherein said photopolymerizable compound bears a group which inhibits transmission of light of wavelength $\lambda$ and which does not promote photo-curing of said composition.

6. The organic electroluminescent device of claim 1, wherein a side of said first deposition-preventing layer forms an angle with said substrate which is smaller than 90°.

7. The organic electroluminescent device of claim 1, further comprising a second deposition-preventing layer partially overlying said first electrode layer and disposed at least partially between said first deposition-preventing layer and said first electrode layer.

8. The organic electroluminescent device of claim 7, wherein said second deposition-preventing layer forms a contiguous perimeter around said active area.

9. The organic electroluminescent device of claim 7, wherein a side of said second deposition-preventing layer forms an angle with said substrate which is greater than 90° and a side of said first deposition-preventing layer forms an angle with said substrate which is smaller than 90°.

10. The organic electroluminescent device of claim 7, wherein said second deposition-preventing layer is made by irradiation of a photosensitive resin composition comprising:
  i) a polymerizable compound; and
  ii) a photoinitiator having an initiation wavelength $\lambda$,
wherein said photosensitive resin composition has a reduced transmission of light of wavelength $\lambda$.

11. The organic electroluminescent device of claim 1, wherein said polymerizable compound has at least one ethylenically unsaturated double bond which is capable of being polymerized by the action of radicals.

12. The organic electroluminescent device of claim 1, wherein said first electrode layer is formed in parallel rows.

13. The organic electroluminescent device of claim 1, wherein said first deposition-preventing layer is formed in parallel rows.

14. The organic electroluminescent device of claim 1, wherein said first electrode layer is formed in parallel rows;
said first deposition-preventing layer is formed in parallel rows; and
said parallel rows of said first electrode layer and said parallel rows of said first deposition-preventing layer form an angle which is greater than 0°.

15. The organic electroluminescent device of claim 14, wherein said angle is between 0° and 90°.

16. The organic electroluminescent device of claim 14, wherein said angle is 90°.

17. A display device comprising:
  i) the organic electroluminescent device of claim 1;
  ii) a control circuit; and
  iii) a power source.

18. The display device of claim 17, comprising a plurality of the organic electroluminescent devices.

19. A method for producing an organic electroluminescent device, which comprises;
  i) forming a first electrode layer on a substrate,
  ii) forming a first deposition-preventing layer partly on said first electrode layer and forming at least a portion of boundaries of an active area of said electroluminescent device, by photo-curing thereon a photosensitive resin composition comprising a polymerizable compound and a photoinitiator having an initiation wavelength $\lambda$, wherein said photosensitive resin composition has a reduced transmission of light of wavelength $\lambda$; and
  iii) forming an organic luminescent layer and a second electrode layer in that order overlying said first electrode layer within said active area.

20. The method of claim 19, wherein said photosensitive resin composition comprises:
  i) a polymerizable compound;
  ii) a photoinitiator having an initiation wavelength $\lambda$; and
  iii) a substance which inhibits transmission of light of wavelength $\lambda$ and which does not promote photo-curing of said composition.

21. The method of claim 20, wherein said substance which inhibits transmission of light of wavelength $\lambda$ is an electroconductive substance.

22. The method of claim 20, wherein said first deposition-preventing layer has a resistivity falling between $1\times10^{12}$ and $1\times10^4$ $\Omega\cdot$cm.

23. The method of claim 19, wherein said photopolymerizable compound bears a group which inhibits transmission of light of wavelength $\lambda$ and which does not promote photo-curing of said composition.

24. The method of claim 19, wherein a side of said first deposition-preventing layer forms an angle with said substrate which is smaller than 90°.

25. The method of claim 19 further comprising forming a second deposition-preventing layer partially overlying said first electrode layer and disposed at least partially between said first deposition-preventing layer and said first electrode layer.

26. The method of claim 25, wherein said second deposition-preventing layer forms a contiguous perimeter around said active area.

27. The method of claim 25, wherein a side of said second deposition-preventing layer forms an angle with said substrate which is greater than 90° and a side of said first deposition-preventing layer forms an angle with said substrate which is smaller than 90°.

28. The method of claim 25, wherein said second deposition-preventing layer is made by irradiation of a photosensitive resin composition comprising:
   i) a polymerizable compound; and
   ii) a photoinitiator having an initiation wavelength $\lambda$, wherein said photosensitive resin composition has a reduced transmission of light of wavelength $\lambda$.

29. The method of claim 19, wherein said polymerizable compound has at least one ethylenically unsaturated double bond which is capable of being polymerized by the action of radicals.

30. An organic electroluminescent device which comprises a substrate, a first electrode layer overlying said substrate, a first deposition-preventing layer partly overlying said first electrode layer and forming at least of portion of the boundaries of an active area of said electroluminescent device, and an organic luminescent layer and a second electrode layer formed in that order overlying said first electrode layer within said active area,
   wherein said first deposition-preventing layer has a resistivity falling between $1\times10^{12}$ and $1\times10^4$ $\Omega\cdot cm$.

31. A method for producing an organic electroluminescent device, which comprises;
   i) forming a first electrode layer on a substrate,
   ii) forming a first deposition-preventing layer partly on said first electrode layer and forming at least a portion of boundaries of an active area of said electroluminescent device; and
   iii) forming an organic luminescent layer and a second electrode layer in that order overlying said first electrode layer within said active area,
   wherein said first deposition-preventing layer has a resistivity falling between $1\times10^{12}$ and $1\times10^4$ $\Omega\cdot cm$.

32. The method of claim 31 further comprising forming a second deposition-preventing layer partially overlying said first electrode layer and disposed at least partially between said first deposition-preventing layer and said first electrode layer.

33. The method of claim 32, wherein a side of said second deposition-preventing layer forms an angle with said substrate which is greater than 90° and a side of said first deposition-preventing layer forms an angle with said substrate which is smaller than 90°.

* * * * *